United States Patent
Chao et al.

(10) Patent No.: US 11,756,978 B2
(45) Date of Patent: Sep. 12, 2023

(54) MULTI-SPECTRAL IMAGE SENSOR

(71) Applicant: META PLATFORMS TECHNOLOGIES, LLC, Menlo Park, CA (US)

(72) Inventors: Qing Chao, Redmond, WA (US); Xinqiao Liu, Medina, WA (US)

(73) Assignee: META PLATFORMS TECHNOLOGIES, LLC, Menlo Park, CA (US)

(*) Notice: Subject to any disclaimer, the term of this patent is extended or adjusted under 35 U.S.C. 154(b) by 365 days.

(21) Appl. No.: 17/184,244

(22) Filed: Feb. 24, 2021

(65) Prior Publication Data
US 2022/0271081 A1    Aug. 25, 2022

(51) Int. Cl.
H01L 27/146    (2006.01)

(52) U.S. Cl.
CPC .... *H01L 27/14652* (2013.01); *H01L 27/1462* (2013.01); *H01L 27/14605* (2013.01)

(58) Field of Classification Search
CPC ......... H01L 27/14652; H01L 27/14605; H01L 27/1462; H01L 27/14645; H01L 27/14649; H01L 27/14627; H01L 27/14629; H01L 27/1463; H01L 27/14621
See application file for complete search history.

(56) References Cited

U.S. PATENT DOCUMENTS

| | | | |
|---|---|---|---|
| 10,700,113 B2 | 6/2020 | Lee | |
| 2005/0040440 A1* | 2/2005 | Murakami | H01L 27/1462 257/E27.152 |

(Continued)

FOREIGN PATENT DOCUMENTS

| | | |
|---|---|---|
| CN | 103472592 B | 11/2015 |
| CN | 108088564 A | 5/2018 |
| WO | 2020066738 A1 | 4/2020 |

OTHER PUBLICATIONS

International Search Report and Written Opinion for International Application No. PCT/US2022/017591, dated May 30, 2022, 8 pages.

(Continued)

*Primary Examiner* — Samuel Park
(74) *Attorney, Agent, or Firm* — Kilpatrick Townsend & Stockton LLP

(57) ABSTRACT

In some examples, an apparatus comprises: a first photodiode to sense a first component of light associated with a first wavelength, and a second photodiode configured to sense a second component of the light associated with a second wavelength, the first component and the second component being associated with, respectively, a first wavelength and a second wavelength. The apparatus further comprises a first optical structure and a second optical structure positioned over, respectively, the first photodiode and the second photodiode. The first optical structure is configured to increase a propagation path of the first component of the light within the first photodiode and has a first optical property based on the first wavelength. The second optical structure is configured to increase a propagation path of the second component of the light within the second photodiode, and has a second optical property based on the second wavelength.

20 Claims, 24 Drawing Sheets

(56) References Cited

U.S. PATENT DOCUMENTS

| | | | |
|---|---|---|---|
| 2014/0021573 A1* | 1/2014 | Nishimaki | H01L 27/14643 |
| | | | 438/57 |
| 2015/0015758 A1* | 1/2015 | Ikeda | H01L 27/14623 |
| | | | 348/308 |
| 2016/0112614 A1* | 4/2016 | Masuda | H04N 25/70 |
| | | | 348/374 |
| 2018/0100731 A1 | 4/2018 | Pau | |
| 2019/0027518 A1* | 1/2019 | Miyata | H01L 27/14621 |
| 2019/0096930 A1 | 3/2019 | Chuang et al. | |
| 2020/0013819 A1 | 1/2020 | Toda | |

OTHER PUBLICATIONS

Hsu, et al., "Full-Stokes Imaging Polarimeter Using an Array of Elliptical Polarizer", Optics Express, vol. 22, No. 3, Feb. 10, 2014, pp. 3063-3074.
PCT/US2021/029006, "International Search Report and Written Opinion", dated Aug. 9, 2021, 13 pages.
Shen, et al., "Optimizing the Design of an Embedded Grating Polarizer for Infrared Polarization Light Field Imaging", Results in Physics, vol. 12, Mar. 2, 2019, pp. 21-31.

\* cited by examiner

MULTI-SPECTRAL IMAGE SENSOR

BACKGROUND OF THE INVENTION

A typical pixel in an image sensor includes a photodiode to sense incident light by converting photons into charge (e.g., electrons or holes). The incident light can include components of different wavelength ranges for different applications, such as two-dimensional (2D) and three-dimensional (3D) sensing. Moreover, to reduce image distortion, a global shutter operation can be performed in which each photodiode of the array of photodiodes senses the incident light simultaneously in a global exposure period to generate the charge. The charge can be converted by a charge sensing unit (e.g., a floating diffusion) to convert to a voltage. The array of pixel cells can measure different components of the incident light based on the voltages converted by the charge sensing unit and provide the measurement results for generation of 2D and 3D images of a scene.

SUMMARY

The present disclosure relates to image sensors. More specifically, and without limitation, this disclosure relates to a multi-spectral image sensor.

In some examples, an apparatus is provided. The apparatus comprises a semiconductor substrate including a first photodiode and a second photodiode, the first photodiode being positioned adjacent to the second photodiode along a first axis, the first photodiode being configured to convert a first component of light to a first charge, the second photodiode being configured to convert a second component of the light to a second charge, the first component and the second component being associated with, respectively, a first wavelength and a second wavelength. The apparatus further comprises a first optical structure and a second optical structure positioned over, respectively, the first photodiode and the second photodiode along a second axis perpendicular to the first axis. The first optical structure is configured to: receive the first component of the light at a first angle with respect to the second axis, and steer the first component of the light at a second angle with respect to the second axis towards the first photodiode, the second angle being configured to increase a propagation path of the first component of the light within the first photodiode compared with the first angle. The second optical structure is configured to: receive the second component of the light at a third angle with respect to the second axis, and steer the second component of the light at a fourth angle with respect to the second axis towards the second photodiode, the fourth angle being configured to increase a propagation path of the second component of the light within the second photodiode compared with the third angle. The first optical structure has a first optical property based on the first wavelength, and the second optical structure has a second optical property based on the second wavelength. The apparatus further comprises an optical element positioned over the first optical structure and the second optical structure along the second axis to receive the light and to project the light towards the first optical structure and the second optical structure.

In some aspects, the first optical structure includes a first protrusion structure having a first sloped-light transmission surface, the first sloped-light transmission surface forming a first slope angle with respect to the second axis. The second optical structure includes a second protrusion structure having a second sloped-light transmission surface, the second sloped-light transmission surface forming a second slope angle with respect to the second axis. The first slope angle is based on the first wavelength. The second slope angle is based on the second wavelength.

In some aspects, the first slope angle is such that at least some of the second component of the light, upon being directed by the first optical structure into the first photodiode as cross-talk, does not undergo a total internal reflection within the first photodiode.

In some aspects, the first protrusion structure has a first width along the first axis. The second protrusion structure has a second width along the first axis. The first protrusion structure and the second protrusion structure have the same height along the second axis.

In some aspects, the first protrusion structure has a first height along the second axis. The second protrusion structure has a second height along the second axis. The first protrusion structure and the second protrusion structure have the same width along the first axis.

In some aspects, the first slope angle and the second slope angle are based on a material cut condition of the semiconductor substrate.

In some aspects, the first protrusion structure and the second protrusion structure comprise at least one of: a triangular pyramid, a trapezium pyramid, a triangular cone, or a trapezium cone.

In some aspects, the first optical structure is made of a first material having a first refractive index for the first wavelength. The second optical structure is made of a second material having a second refractive index for the second wavelength.

In some aspects, the first refractive index is based on a first target critical angle for the total internal reflection within the first photodiode, and the first slope angle. The second refractive index is based on a second target critical angle for the total internal reflection within the second photodiode, and the second slope angle.

In some aspects, the first optical structure includes an array of first protrusion structures configured to diffract the first component of the light and direct the diffracted first component of the light into the first photodiode, the array of first protrusion structures having a first pitch size. The second optical structure includes an array of second protrusion structures configured to diffract the second component of the light and direct the diffracted second component of the light into the second photodiode, the array of second protrusion structures having a second pitch size. The first pitch size is based on the first wavelength. The second pitch size is based on the second wavelength.

In some aspects, each first protrusion structure of the array of first protrusion structures includes a first sloped light transmission surface, the first sloped light transmission surface forming a first slope angle with respect to the second axis. Each second protrusion structure of the array of second protrusion structures includes a second sloped light transmission surface, the second sloped light transmission surface forming a second slope angle with respect to the second axis. The first slope angle is based on the first wavelength. The second slope angle is based on the second wavelength.

In some aspects, the semiconductor substrate further comprises a first deep trench isolation (DTI) formed on one side of the first photodiode along the second axis and a second DTI formed on one side of the second photodiode along the second axis. The total internal reflection of the first component of the light occurs on the first DTI. The total internal reflection of the second component of the light occurs on the second DTI.

In some aspects, each of the first photodiode and the second photodiode has a triangular footprint.

In some aspects, the optical element is configured to direct light from a spot of a scene to both the first photodiode and the second photodiode.

In some aspects, the first photodiode and the second photodiode are part of, respectively, a first sub-pixel and a second sub-pixel. The apparatus is configured to: generate a first pixel of a first image frame based on a first output of the first photodiode; and generate a second pixel of a second image frame based on a second output of the second photodiode. The first pixel corresponds to the second pixel.

In some aspects, the optical element comprises at least one of: a microlens, a metalens, or a liquid crystal hologram.

In some examples, an apparatus is provided. The apparatus comprises an array of pixel cells, each pixel cell comprising: a semiconductor substrate including a first photodiode and a second photodiode, the first photodiode being positioned adjacent to the second photodiode along a first axis, the first photodiode being configured to convert a first component of light to a first charge, the second photodiode being configured to convert a second component of the light to a second charge, the first component and the second component being associated with, respectively, a first wavelength and a second wavelength. Each pixel cell further comprises a first optical structure and a second optical structure positioned over, respectively, the first photodiode and the second photodiode along a second axis perpendicular to the first axis. The first optical structure is configured to: receive the first component of the light at a first angle with respect to the second axis, and steer the first component of the light at a second angle with respect to the second axis towards the first photodiode, the second angle being configured to increase a propagation path of the first component of the light within the first photodiode compared with the first angle. The second optical structure is configured to: receive the second component of the light at a third angle with respect to the second axis, and steer the second component of the light at a fourth angle with respect to the second axis towards the second photodiode, the fourth angle being configured to increase a propagation path of the second component of the light within the second photodiode compared with the third angle. The first optical structure has a first optical property based on the first wavelength. The second optical structure has a second optical property based on the second wavelength. The apparatus further comprises one or more optical elements positioned over the array of pixel cells along the second axis to receive the light and to project the light towards the first optical structure and the second optical structure of each pixel cell of the array of pixel cells.

In some aspects, the first optical structure includes an array of first protrusion structures configured to diffract the first component of the light and direct the diffracted first component of the light into the first photodiode, the array of first protrusion structures having a first pitch size based on the first wavelength. The second optical structure includes an array of second protrusion structures configured to diffract the second component of the light and direct the diffracted second component of the light into the second photodiode, the array of second protrusion structures having a second pitch size based on the second wavelength. Each first protrusion structure of the array of first protrusion structures includes a first sloped light transmission surface, the first sloped light transmission surface forming a first slope angle with respect to the second axis. Each second protrusion structure of the array of second protrusion structures includes a second sloped light transmission surface, the second sloped light transmission surface forming a second slope angle with respect to the second axis. The first slope angle is based on the first wavelength. The second slope angle is based on the second wavelength.

In some aspects, the apparatus further comprises a processor configured to process outputs of the array of pixel cells to generate image frames, and a display configured to display content based on the image frames.

In some aspects, the apparatus is part of a mobile device.

BRIEF DESCRIPTION OF THE DRAWINGS

Illustrative examples are described with reference to the following figures.

Figure 1A:
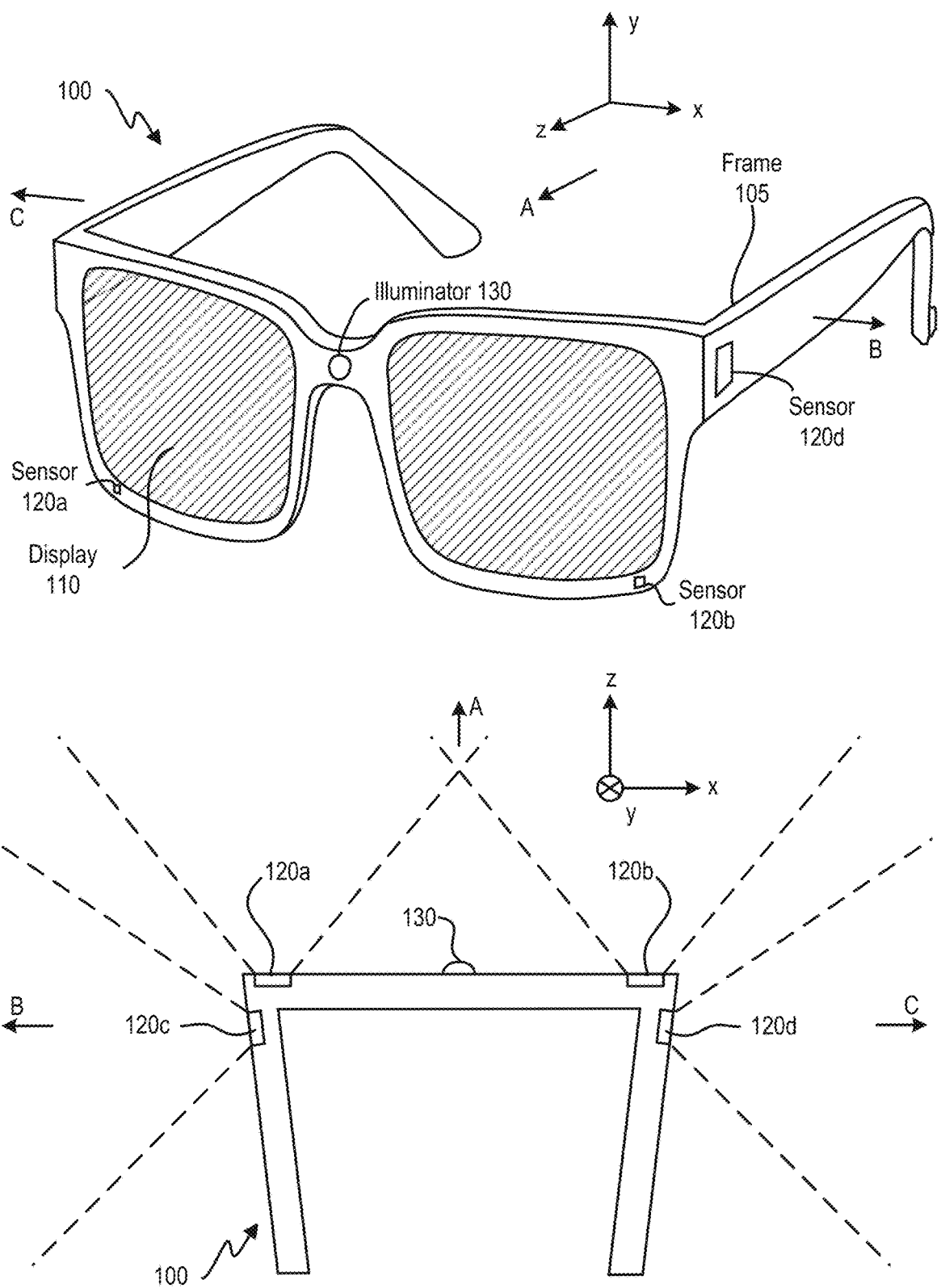
FIGS. 1A and 1B are diagrams of an example of a near-eye display.

The figures depict examples of the present disclosure for purposes of illustration only. One skilled in the art will readily recognize from the following description that alternative examples of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive examples. However, it will be apparent that various examples may be practiced without these specific details. The figures and description are not intended to be restrictive.

A typical image sensor includes an array of pixel cells. Each pixel cell includes a photodiode to measure the intensity incident light by converting photons into charge (e.g., electrons or holes). The charge generated by the photodiode can be converted to a voltage by a charge sensing unit, which can include a floating drain node. The voltage can be quantized by an analog-to-digital converter (ADC) into a digital value. The digital value can represent an intensity of light received by the pixel cell and can form a pixel, which can correspond to light received from a spot of a scene. An image comprising an array of pixels can be derived from the digital outputs of the array of pixel cells.

An image sensor can be used to perform different modes of imaging, such as 2D and 3D sensing. The 2D and 3D sensing can be performed based on light of different wavelength ranges. For example, visible light can be used for 2D sensing, whereas invisible light (e.g., infrared light) can be used for 3D sensing. An image sensor may include an optical filter array to allow visible light of different optical wavelength ranges and colors (e.g., red, green, blue, monochrome) to a first set of pixel cells assigned for 2D sensing, and invisible light to a second set of pixel cells assigned for 3D sensing.

To perform 2D sensing, a photodiode at a pixel cell can generate charge at a rate that is proportional to an intensity of visible light component (e.g., red, green, blue, monochrome) incident upon the pixel cell, and the quantity of charge accumulated in an exposure period can be used to represent the intensity of visible light (or a certain color component of the visible light). The charge can be stored temporarily at the photodiode and then transferred to a capacitor (e.g., a floating diffusion) to develop a voltage. The voltage can be sampled and quantized by an analog-to-digital converter (ADC) to generate an output corresponding to the intensity of visible light. An image pixel value can be generated based on the outputs from multiple pixel cells configured to sense different color components of the visible light (e.g., red, green, and blue colors).

Moreover, to perform active illumination based 3D sensing, light of a different wavelength range (e.g., infrared light) can be projected onto an object, and the reflected light can be detected by the pixel cells. The light can include structured light, light pulses, etc. The pixel cells outputs can be used to perform depth-sensing operations based on, for example, detecting patterns of the reflected structured light, measuring a time-of-flight of the light pulse. To detect patterns of the reflected structured light, a distribution of quantities of charge generated by the pixel cells during the exposure time can be determined, and pixel values can be generated based on the voltages corresponding to the quantities of charge. For time-of-flight measurement, the timing of generation of the charge at the photodiodes of the pixel cells can be determined to represent the times when the reflected light pulses are received at the pixel cells. Time differences between when the light pulses are projected to the object and when the reflected light pulses are received at the pixel cells can be used to provide the time-of-flight measurement.

A pixel cell array can be used to generate information of a scene. In some examples, each pixel cell (or at least some of the pixel cells) of the pixel cell array can process multi-spectral light to perform collocated 2D and 3D sensing at the same time. For example, a pixel cell may include multiple photodiodes, each configured to convert a different spectral component of light to charge. For 2D sensing, a photodiode can be configured to convert visible light (e.g., monochrome, or for a color of a particular frequency range) to charge, whereas another photodiode can be configured to convert infrared light to charge for 3D sensing. Having the same set of pixel cells to perform sensing of different spectral components of light can facilitate the correspondence between 2D and 3D images of different spectral components of light generated by the pixel cells. Moreover, given that every pixel cell of a pixel cell array can be used to generate the image, the full spatial resolution of the pixel cell array can be utilized for the imaging.

The 2D and 3D imaging data can be fused for various applications that provide virtual reality (VR), augmented reality (AR) and/or mixed reality (MR) experiences. For example, a wearable VR/AR/MR system may perform a scene reconstruction of an environment in which the user of the system is located. Based on the reconstructed scene, the VR/AR/MR can generate display effects to provide an interactive experience. To reconstruct a scene, the 3D-image data can be used to determine the distances between physical objects in the scene and the user. Moreover, 2D-image data can capture visual attributes, including textures, colors, and reflectivity of these physical objects. The 2D- and 3D-image data of the scene can then be merged to create, for example, a 3D model of the scene including the visual attributes of the objects. As another example, a wearable VR/AR/MR system can also perform a head tracking operation based on a fusion of 2D and 3D image data. For example, based on the 2D image data, the VR/AR/MR system can extract certain image features to identify an object. Based on the 3D image data, the VR/AR/MR system can track a location of the identified object relative to the wearable device worn by the user. The VR/AR/MR system can track the head movement based on, for example, tracking the change in the location of the identified object relative to the wearable device as the user's head moves. Other applications of the 2D- and 3D-imaging operations may include, for example, determining a time-of-flight, security cameras, and/or personal authentication and identification.

One challenge of implementing an image sensor is how to enable the photodiodes to efficiently absorb light to generate the charge. A low absorption efficiency means a photodiode will need to be exposed to light of a higher intensity to generate a certain quantity of charge, which can reduce the signal-to-noise ratio (SNR). Specifically, the output of the image sensor typically includes a signal component attributed to the detected light from the photodiode, as well as a noise component attributed to noise introduced by other components of the image sensor (e.g., electronic noise, dark charge). If the absorption efficiency is low, and if the detected light has a low intensity, the output of the image sensor may include a large noise component relative to the signal component attributed to the detected light, and the signal component may become indistinguishable from the noise component. The image sensor's performance in measuring the low intensity light may become degraded as a result. Therefore, it is desirable to increase the absorption efficiency to improve the performance of the image sensor.

In addition, in a multi-spectral pixel cell that includes a plurality of photodiodes, each photodiode may be assigned to convert a particular frequency component (in-band light component) of light to charge, and not to convert other frequency components of the light (out-of-band light components) to charge. For such a pixel cell, the charge generated from the out-of-band light components appear as crosstalk and are undesirable and should be minimized, while the charge generated from the in-band component is desirable and should be maximized. To increase the ratio between the in-band and out-of-band light components in the photodiode output, it is also desirable to increase the absorption efficiency of the photodiode for the in-band component and to decrease the absorption efficiency for the out-of-band light components.

The present disclosure relates to an image sensor that can address at least some of the issues above. The image sensor may include an array of pixel cells. Each pixel cell may include a plurality of photodiodes formed in photosensitive regions of a semiconductor substrate, and may include a first photodiode and a second photodiode, the first photodiode being positioned adjacent to the second photodiode along a first axis (e.g., a horizontal axis). Each photodiode can correspond to a sub-pixel of the pixel cell. Each pixel cell further includes a first optical structure and a second optical structure positioned over, respectively, the first photodiode and the second photodiode along a second axis (e.g., a vertical axis) perpendicular to the first axis. The image sensor further includes one or more microlenses positioned over the first optical structure and the second optical structure along the second axis, such that the microlenses, the optical structures, and the photodiodes form a stack along the second axis. The one or more microlenses can collect light and direct the light to the first optical structure and the second optical structure of each pixel cell. The first optical structure and the second optical structure of each pixel cell can then direct the light to, respectively, the first photodiode and the second photodiode of the pixel cell.

The pixel cell may further include a filter layer including a first filter and a second filter, with the first filter positioned adjacent to the second filter along the first axis. The filter layer can be positioned between the microlens and the first and second optical structures. The first filter can selectively pass a first component of the light to the first optical structure, which can then direct the first component of the light to the first photodiode. The second filter can selectively pass a second component of the light to the second optical structure, which can then direct the second component of the light to the second photodiode. The first light component can be associated with a first wavelength (e.g., visible light) and is a first in-band light component for the first photodiode, whereas the second light component can be associated with a second wavelength (e.g., infrared or near infrared) and can be a second in-band light component for the second photodiode. The first photodiode can convert the first component of the light to a first charge, whereas the second photodiode can convert the second component of the light to a second charge. After passing through the filter layer, the first component and the second component can propagate along the vertical axis towards, respectively, the first photodiode and the second photodiode.

The first optical structure and the second optical structure have different optical properties, where the optical property of the first optical structure is configured based on the first wavelength and the optical property of the second optical structure is configured based on the second wavelength. The optical property enables an optical structure can selectively steer an in-band light component, based on its wavelength, away from the vertical axis and towards a sidewall of the respective photodiode. The in-band light component can be reflected off the sidewall, and may undergo additional internal reflections within the photodiode (e.g., on a bottom surface of the photodiode, on another sidewall of the photodiode). Due to the reflections, the propagation path of the in-band light within the photodiode can be extended, which can improve the absorption efficiency of the in-band light component by the photodiode. Meanwhile, the out-of-band light component, which have been substantially attenuated by the filter layer, may experience a lesser degree of steering from the optical structure and experience fewer reflections within the photodiode, which can further shorten the propagation path and reduce the absorption efficiency of the out-of-band light component by the photodiode.

The first optical structure and the second optical structure can steer their respective in-band light components based on various mechanisms. One example mechanism is refraction. The optical structures can steer the in-band light components based on refraction when the pitch size is smaller than (e.g., 50%-70%) of the wavelength of the in-band light component to be steered. Specifically, each optical structure can include a sloped light transmission surface that forms a slope angle with the second axis. The light can be refracted at the light transmission surface of the optical structure, and the refracted light can reach the sidewall at an incident angle that exceeds a critical angle for a total internal reflection, which enables the light to reflect on the sidewall rather than passing through the sidewall. The critical angle, however, is a function of the wavelength of the incident light, and the first and second light components can have different critical angles. Each optical structure can be configured to refract the respective in-band light component for a photodiode, such that the in-band light component reaches the side wall of the photodiode at an incident angle above the critical angle for the in-band light component to reflect off the sidewall. Moreover, the out-of-band light component can be refracted by the optical structure such that the out-of-band light component reaches the side wall of the photodiode at an incident angle below the critical angle for the out-of-band light component to minimize reflection.

The first and second optical structures can have different refractive properties tailored based on the wavelengths of the respective in-band light component of each photodiode to maximize the reflection of the in-band light component at the sidewalls, which in turn can increase the internal reflection and absorption of the in-band light component within the photodiode. Specifically, in one example, the first and second optical structures can have different geometries, such as different slope angles for the sloped light transmission surfaces, to refract the respective in-band light components of different incident wavelengths at different refraction angles. This can ensure that the incident angle of each in-band light component on the sidewall exceeds the wavelength-dependent critical angle for the in-band light component. For example, the sloped angle of the first optical structure can be determined based on a first wavelength range of a first light component, whereas the sloped angle of the second optical structure can be determined based on a second wavelength range of a second in-band light component. The first optical structure can have a larger sloped angle than the second optical structure if the first in-band light component, to be absorbed by the first photodiode, has a longer incident wavelength than the second in-band light component to be absorbed by the second photodiode.

In another example, the first and second optical structures can have different materials, which can provide different refractive indices for the same incident wavelength. The material for each optical structure can be selected to achieve a target critical angle for each in-band light component. The target critical angle for each light component can be set to ensure that the incident angle on the sidewall for the light component exceeds the respective critical angle. The optical structures can have protrusion structures in various shapes such as triangular pyramids, trapezium pyramids, cones, and/or trapezium cones.

Another example mechanism by which the first optical structure and the second optical structure can steer their in-band light component can be based on diffraction. Diffraction can occur when light bends after passing through an opening, such as a slit, a pin hole, etc., having a width that is equal to or larger than the wavelength of the light. As the light propagate through the opening and become diffracted, constructive interference can occur between the diffracted light to form light beams. The optical structure can operate like a single slit or a single pin hole to diffract and bend light that passes through the filter layer, with the pitch size of the optical structure (a width along the first axis/horizontal axis) corresponding to a width of the single slit/pin hole. The diffracted light can form light beams based on constructive interference, and the light beams can propagate at specific angles from the second/vertical axis, with the specific angles given by a ratio between the wavelength of the light and the pitch of the optical structure. Some of the light beams can be reflected off the sidewall and undergo additional internal reflections within the photodiode to enhance the absorption of the light. The sidewalls may include a layer of reflective material, such metal formed in a deep trench isolation (DTI), to reflect the light.

The first and second optical structures can have different diffraction properties tailored based on the wavelengths of the respective in-band light component of each photodiode to maximize the reflection of the in-band light component at the sidewalls, which in turn can increase the internal reflection and absorption of the in-band light component within the photodiode. Specifically, the first and second optical structures can have different pitch sizes, with the pitch size configured based on the wavelength of the in-band light components to be diffracted. For example, the pitch size of each optical structure can be made equal to or larger than the wavelength of the respective in-band light component, to maximum the diffraction and internal reflection of the respective in-band light component. Moreover, the diffraction and internal reflection of the respective out-of-band light component can be reduced due to, for example, the wavelength of the out-of-band light component being shorter than the pitch of the optical structure. To maximize the diffraction of different in-band light components of different wavelengths, the first and second optical structures can have different pitch sizes that match the different wavelengths of the different in-band light components.

In some examples, the first and second optical structures can steer the in-band light component through a combination of diffraction and refraction. The geometries of the first and second optical structures can be configured to, for example, allow one of diffraction or refraction to dominate. For example, as explained above, refraction can dominate when the pitch size is smaller than the wavelength of the in-band component, whereas diffraction can dominate when the pitch size is equal to or larger than the wavelength of the in-band component. Moreover, in a case where the selected pitch size of the optical structure is below the pitch size of a photodiode (e.g., to allow refraction to dominate), an array of protrusion structures can be formed over the photodiode as the first or second optical structure, with the pitch size and geometry (e.g., slope angle, height, etc.) of each protrusion structure configured based on the wavelength of the in-band component to be diffracted and internally reflected.

In some examples, each of the first optical structure and the second optical structure can include an array of protrusion structures. An array of protrusion structures can diffract the light to form multiple light beams due to constructive interference, and the diffracted light can propagate at different angles within the photodiode, which can extend the propagation path of the light within the photodiodes and improve the absorption efficiency of the light by the photodiode. In addition, each protrusion structure can cause the light to undergo total internal reflection within the sub-pixel to further enhance the absorption of the light by the photodiode. A pitch size of the array of protrusion structures can be made similar to the wavelength of the in-band light component to increase the diffraction of the in-band light component. The pitch size can also set the slope angle of the light transmission surface of each protrusion structure within the array to facilitate the total internal reflection of the in-band light component at the photodiode.

With examples of the present disclosure, an optical structure is provided to facilitate internal reflection of light within a photodiode, which can improve the absorption efficiency of the light by the photodiode. The absorption efficiency can be further improved when the optical structure is configured based on the wavelength/frequency of the in-band light component to be measured by the photodiode, and optical structures having different optical properties based on the wavelengths/frequencies of different light components to be measured by different photodiodes can be provided for those photodiodes. All these can improve the absorption efficiency of light of a multi-spectral image sensor, which can improve the performance of the applications (e.g., VR/AR/MR applications) that rely on the outputs of the multi-spectral image sensor.

The disclosed techniques may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some examples, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HIVID) connected to a host computer system, a standalone HMD, a mobile device or computing system, or any other hardware platform capable of providing artificial reality content to one or more viewers.

FIG. 1A is a diagram of an example of a near-eye display 100. Near-eye display 100 presents media to a user. Examples of media presented by near-eye display 100 include one or more images, video, and/or audio. In some examples, audio is presented via an external device (e.g., speakers and/or headphones) that receives audio information from the near-eye display 100, a console, or both, and presents audio data based on the audio information. Near-eye display 100 is generally configured to operate as a VR display. In some examples, near-eye display 100 is modified to operate as an AR display and/or a mixed reality (MR) display.

Near-eye display 100 includes a frame 105 and a display 110. Frame 105 is coupled to one or more optical elements. Display 110 is configured for the user to see content presented by near-eye display 100. In some examples, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel array configured to generate image data representing different fields of views along different directions. For example, sensors 120a and 120b may be configured to provide image data representing two fields of view towards a direction A along the Z axis, whereas sensor 120c may be configured to provide image data representing a field of view towards a direction B along the X axis, and sensor 120d may be configured to provide image data representing a field of view towards a direction C along the X axis.

In some examples, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some examples, the location tracking system may operate a simultaneous localization and mapping (SLAM) algorithm to track a set of objects in the physical environment and within a field of view of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such an arrangement, the accuracy and robustness of tracking a location of the user within the physical environment can be improved.

In some examples, near-eye display 100 may further include one or more active illuminators 130 to project light into the physical environment. The light projected can be associated with different frequency spectrums (e.g., visible light, infrared light, ultraviolet light), and can serve various purposes. For example, illuminator 130 may project light in a dark environment (or in an environment with low intensity of infrared light, ultraviolet light, etc.) to assist sensors 120a-120d in capturing images of different objects within the dark environment to, for example, enable location tracking of the user. Illuminator 130 may project certain markers onto the objects within the environment, to assist the location tracking system in identifying the objects for map construction/updating.

In some examples, illuminator 130 may also enable stereoscopic imaging. For example, one or more of sensors 120a or 120b can include both a first pixel array for visible light sensing and a second pixel array for infrared (IR) light sensing. The first pixel array can be overlaid with a color filter (e.g., a Bayer filter), with each pixel of the first pixel array being configured to measure intensity of light associated with a particular color (e.g., one of red, green, or blue colors). The second pixel array (for IR light sensing) can also be overlaid with a filter that allows only IR light through, with each pixel of the second pixel array being configured to measure intensity of IR lights. The pixel arrays can generate a RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or an outdoor environment, and/or at different times of the day. Near-eye display 100 may also operate with or without active illuminator 130 being turned on. As a result, image sensors 120a-120d may need to have a wide dynamic range to be able to operate properly (e.g., to generate an output that correlates with the intensity of incident light) across a very wide range of light intensities associated with different operating environments for near-eye display 100.

Figure 1B:
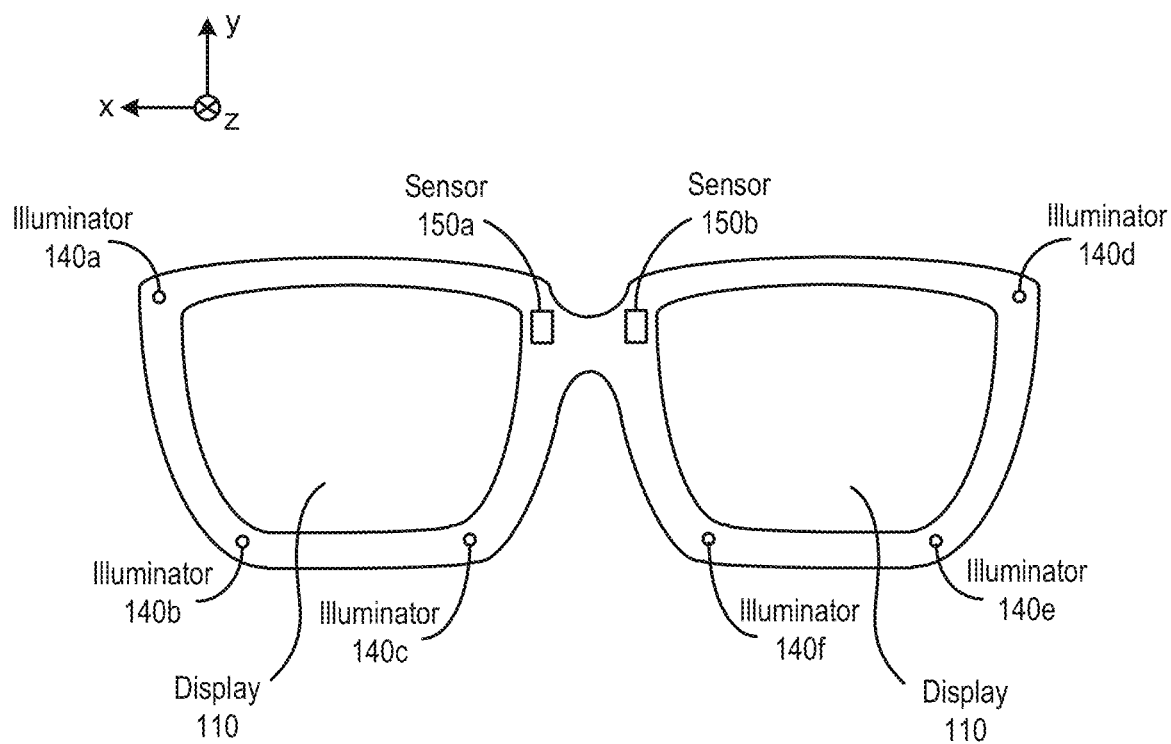

FIG. 1B is a diagram of another example of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain frequency range (e.g., near infrared (NIR)) towards direction D (which is opposite to direction A of FIG. 1A). The emitted light may be associated with a certain pattern, and can be reflected by the left eyeball of the user. Sensor 150a may include a pixel array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel array to generate an image of the reflected pattern. Based on the images of the reflected pattern from sensors 150a and 150b, the system can determine a gaze point of the user, and update the image data provided to display 100 based on the determined gaze point to provide an interactive experience to the user.

As discussed above, to avoid damaging the eyeballs of the user, illuminators 140a, 140b, 140c, 140d, 140e, and 140f are typically configured to output lights of very low intensities. In a case where image sensors 150a and 150b comprise the same sensor devices as image sensors 120a-120d of FIG. 1A, the image sensors 120a-120d may need to be able to generate an output that correlates with the intensity of incident light when the intensity of the incident light is very low, which may further increase the dynamic range requirement of the image sensors.

Moreover, the image sensors 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120a-120d need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 1B:
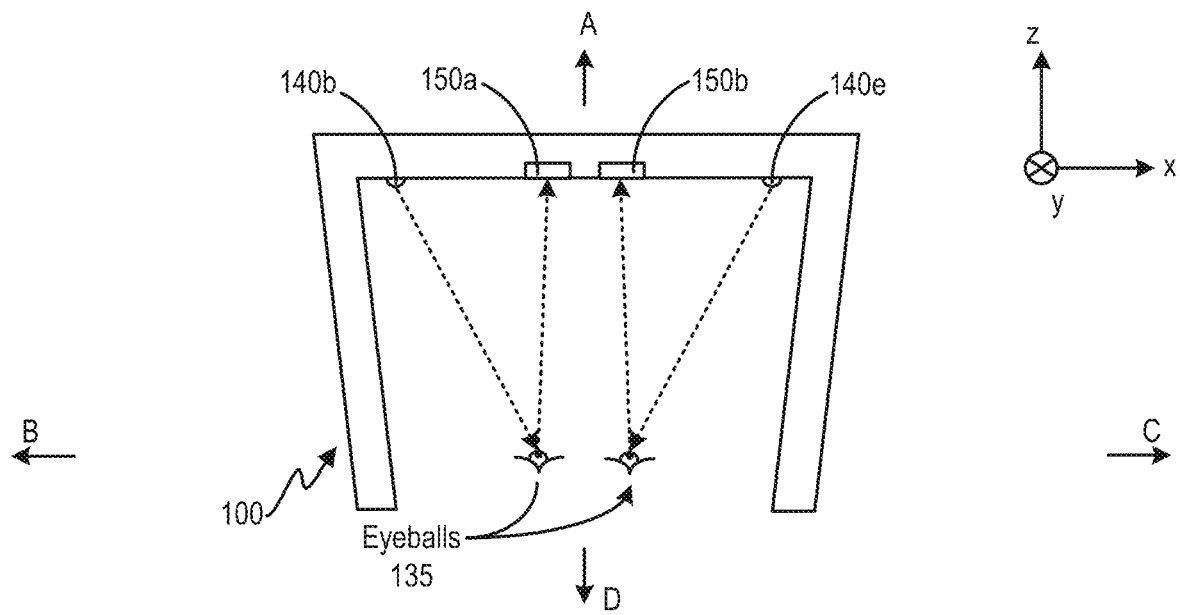
Figure 2:
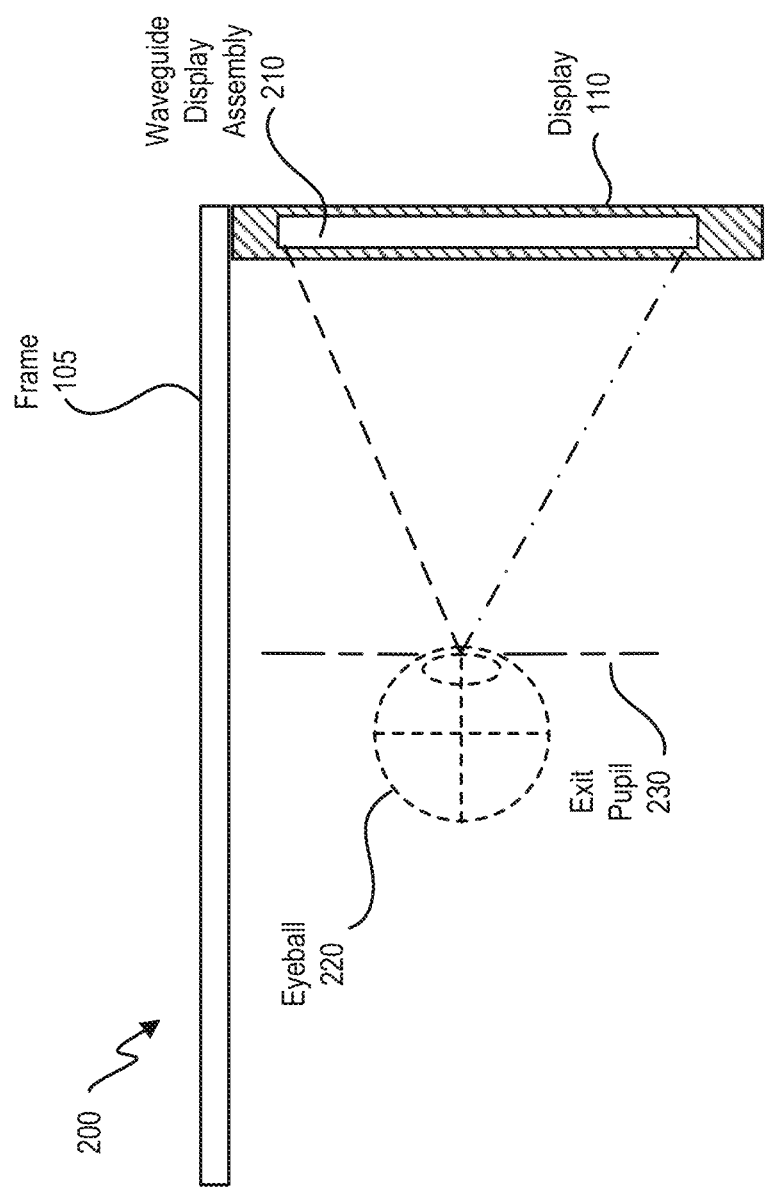
FIG. 2 is an example of a cross section of the near-eye display.

FIG. 2 is an example of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass) with one or more refractive indices. In some examples, near-eye display 100 includes one or more optical elements between waveguide display assembly 210 and eyeball 220.

In some examples, waveguide display assembly 210 includes a stack of one or more waveguide displays including, but not restricted to, a stacked waveguide display and/or a varifocal waveguide display. The stacked waveguide display is a polychromatic display (e.g., a RGB display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate examples, waveguide display assembly 210 may include the stacked waveguide display and the varifocal waveguide display.

Figure 3:
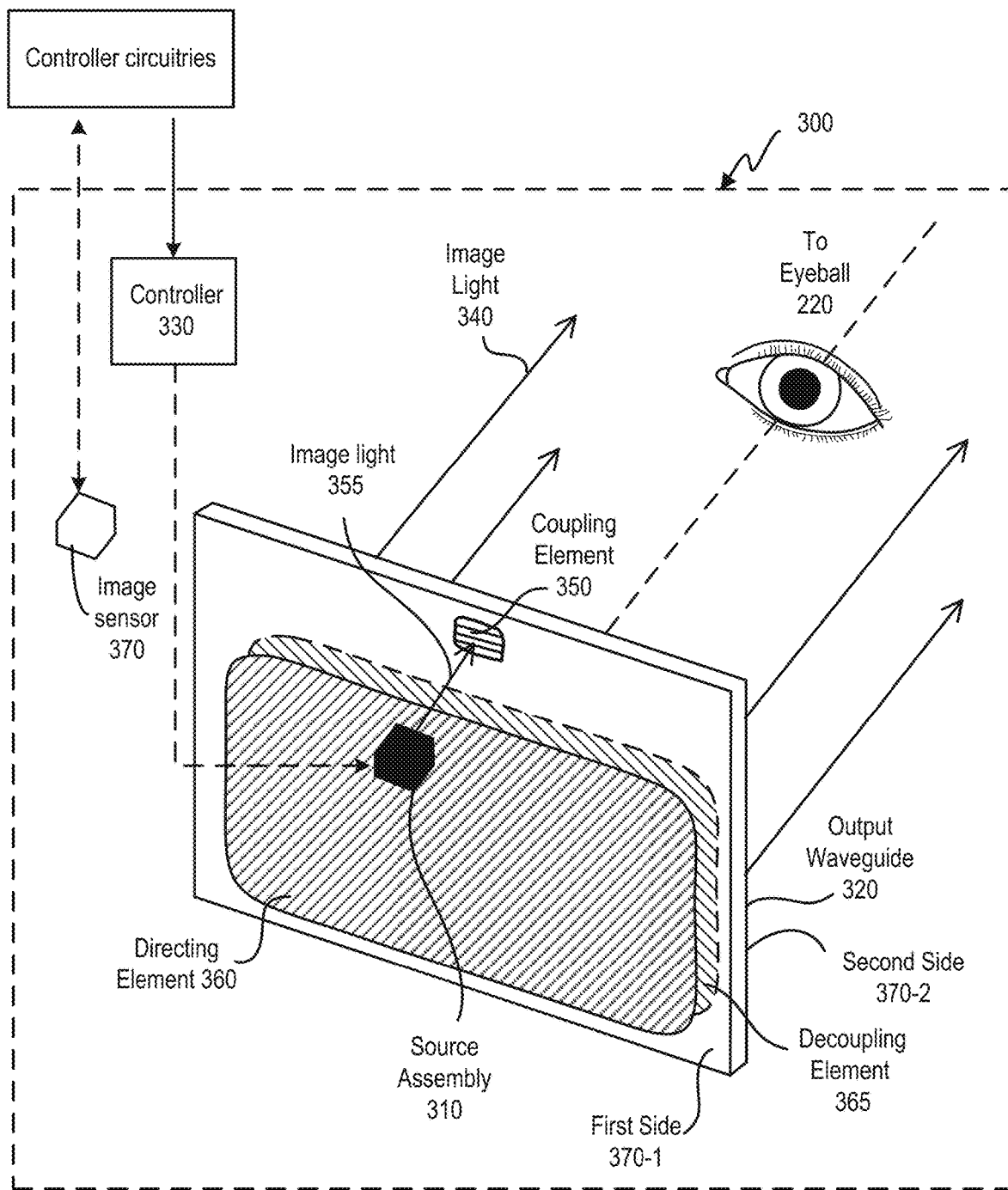
FIG. 3 illustrates an isometric view of an example of a waveguide display with a single source assembly.

FIG. 3 illustrates an isometric view of an example of a waveguide display 300. In some examples, waveguide display 300 is a component (e.g., waveguide display assembly 210) of near-eye display 100. In some examples, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some examples, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some examples, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of, e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some examples, the output waveguide 320 outputs expanded image light 340 to the user's eyeball 220 with a large field of view (FOV). For example, the expanded image light 340 is provided to the user's eyeball 220 with a diagonal FOV (in x- and y-dimensions) of 60 degrees and/or greater and/or 150 degrees and/or less. The output waveguide 320 is configured to provide an eyebox with a length of 20 mm or greater and/or equal to or less than 50 mm, and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A to generate image data of a physical environment in front of the user (e.g., for location determination). Image sensor 370 may also be located on second side 370-2 and may include image sensors 150a and 150b of FIG. 1B to generate image data of eyeball 220 (e.g., for gaze point determination) of the user. Image sensor 370 may interface with a remote console that is not located within waveguide display 300. Image sensor 370 may provide image data to the remote console, which may determine, for example, a location of the user and/or a gaze point of the user, and determine the content of the images to be displayed to the user. The remote console can transmit instructions to controller 330 related to the determined content. Based on the instructions, controller 330 can control the generation and outputting of image light 355 by source assembly 310.

Figure 4:
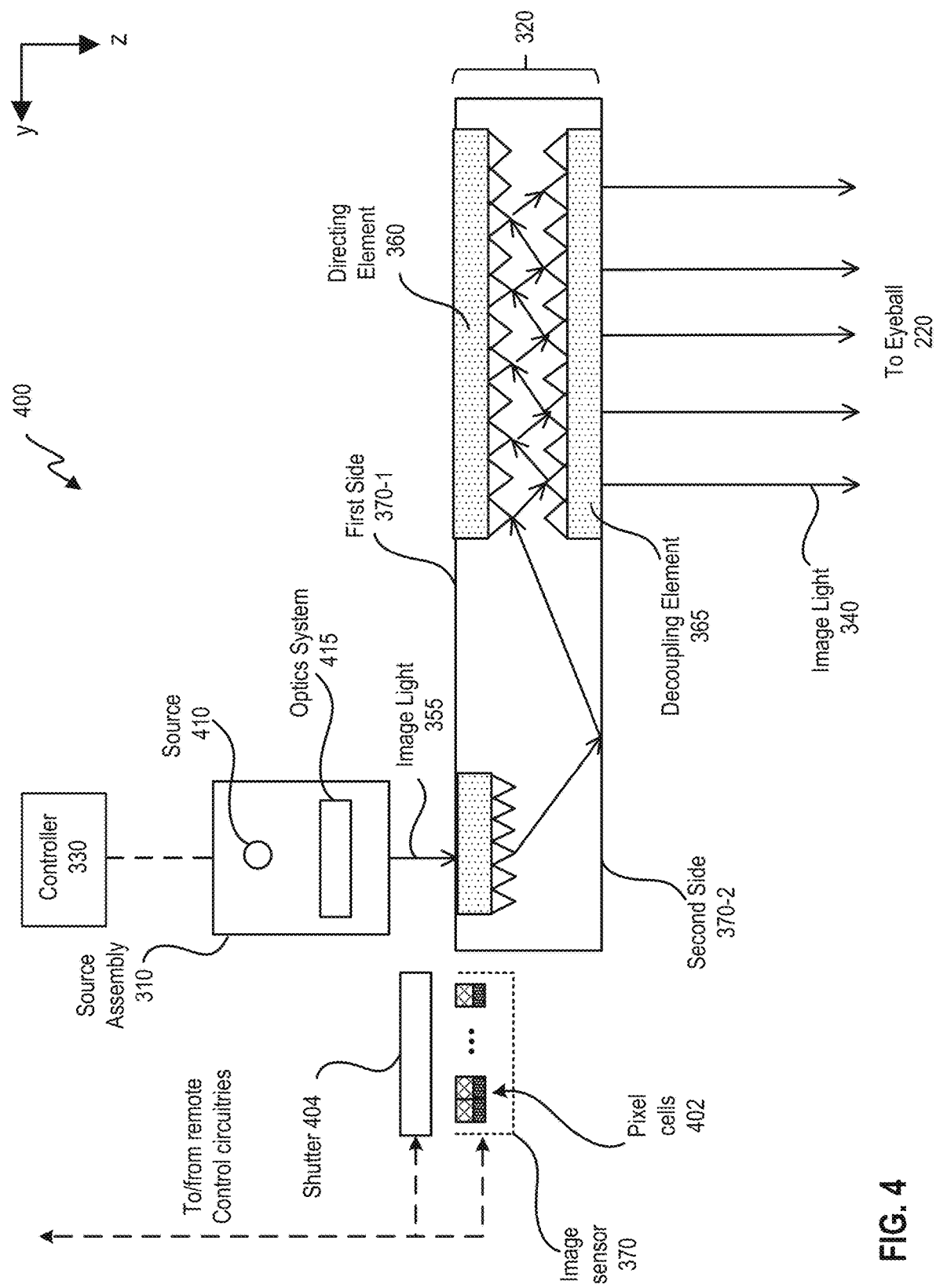
FIG. 4 illustrates a cross section of an example of the waveguide display.

FIG. 4 illustrates an example of a cross section 400 of the waveguide display 300. The cross section 400 includes source assembly 310, output waveguide 320, and image sensor 370. In the example of FIG. 4, image sensor 370 may include a set of pixel cells 402, located on first side 370-1, to generate an image of the physical environment in front of the user. In some examples, there can be a mechanical shutter 404 interposed between the set of pixel cells 402 and the physical environment to control the exposure of the set of pixel cells 402. In some examples, the mechanical shutter 404 can be replaced by an electronic shutter gate, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some examples, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In examples where coupling element 350 is a diffraction grating, a pitch of the diffraction grating is chosen such that total internal reflection occurs in output waveguide 320, and image light 355 propagates internally in output waveguide 320 (e.g., by total internal reflection) toward decoupling element 365.

Directing element 360 redirects image light 355 toward decoupling element 365 for decoupling from output waveguide 320. In examples where directing element 360 is a diffraction grating, the pitch of the diffraction grating is chosen to cause incident image light 355 to exit output waveguide 320 at angle(s) of inclination relative to a surface of decoupling element 365.

In some examples, directing element 360 and/or decoupling element 365 are structurally similar. Expanded image light 340 exiting output waveguide 320 is expanded along one or more dimensions (e.g., may be elongated along x-dimension). In some examples, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
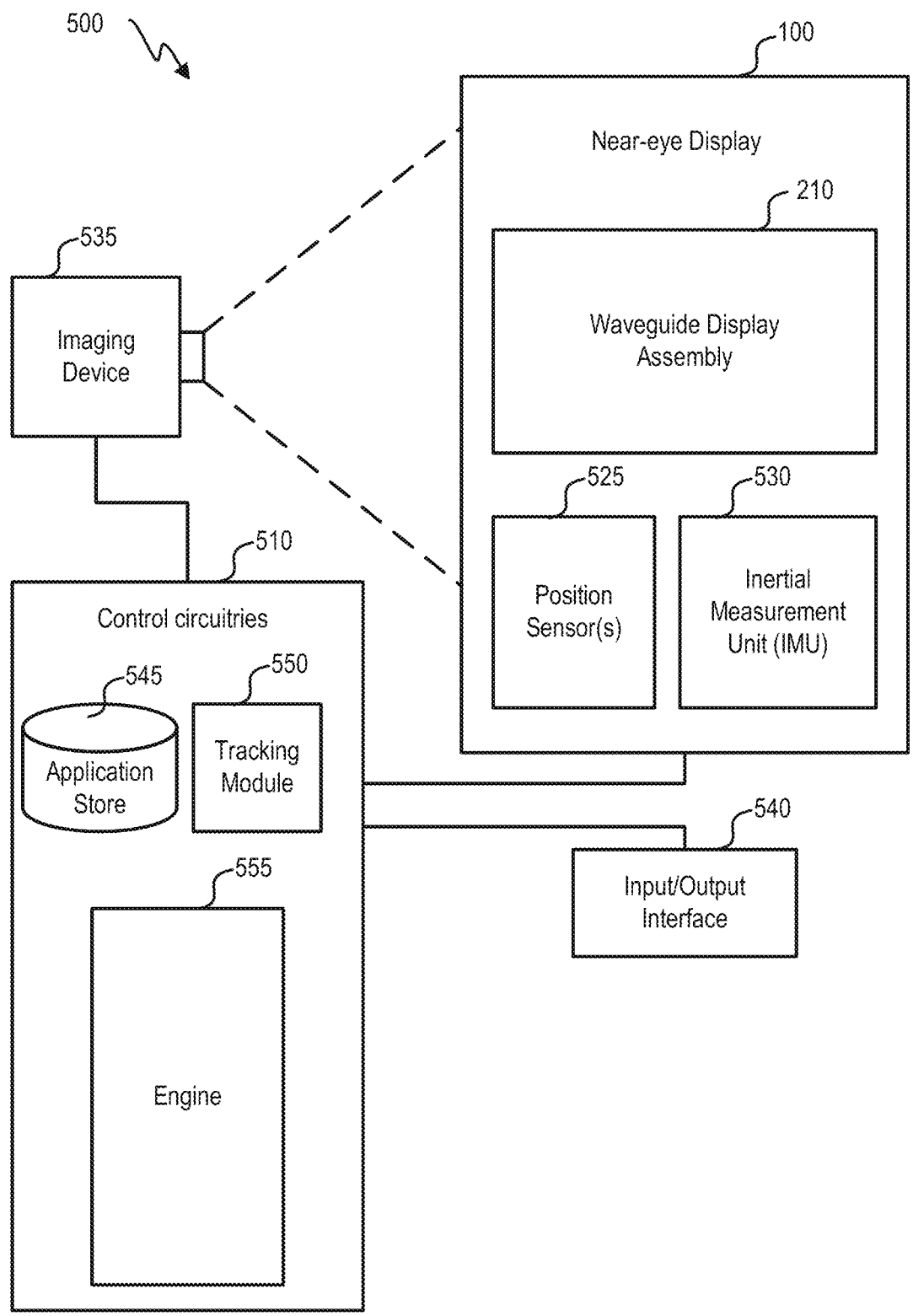
FIG. 5 is a block diagram of an example of a system including the near-eye display.

FIG. 5 is a block diagram of an example of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some examples, audio is presented via an external device (e.g., speakers and/or headphones) that receives audio information from near-eye display 100 and/or control circuitries 510 and presents audio data based on the audio information to a user. In some examples, near-eye display 100 may also act as an AR eyewear glass. In some examples, near-eye display 100 augments views of a physical, real-world environment, with computer-generated elements (e.g., images, video, sound).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100, based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating image data of a physical environment in which the user is located to perform location tracking of the user. Imaging device 535 may further include, for example, image sensors 150a-150b of FIG. 1B for generating image data for determining a gaze point of the user to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provide media to near-eye display 100 for presentation to the user in accordance with information received from one or more of: imaging device 535, near-eye display 100, and input/output interface 540. In some examples, control circuitries 510 can be housed within system 500, configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions that, when executed by a processor, generates content for presentation to the user. Examples of applications include: gaming applications, conferencing applications, video playback applications, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some examples, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), a gaze point of the user (e.g., based on image data provided by imaging device 535), or a distance between an object and user (e.g., based on image data provided by imaging device 535).

Figure 6A:
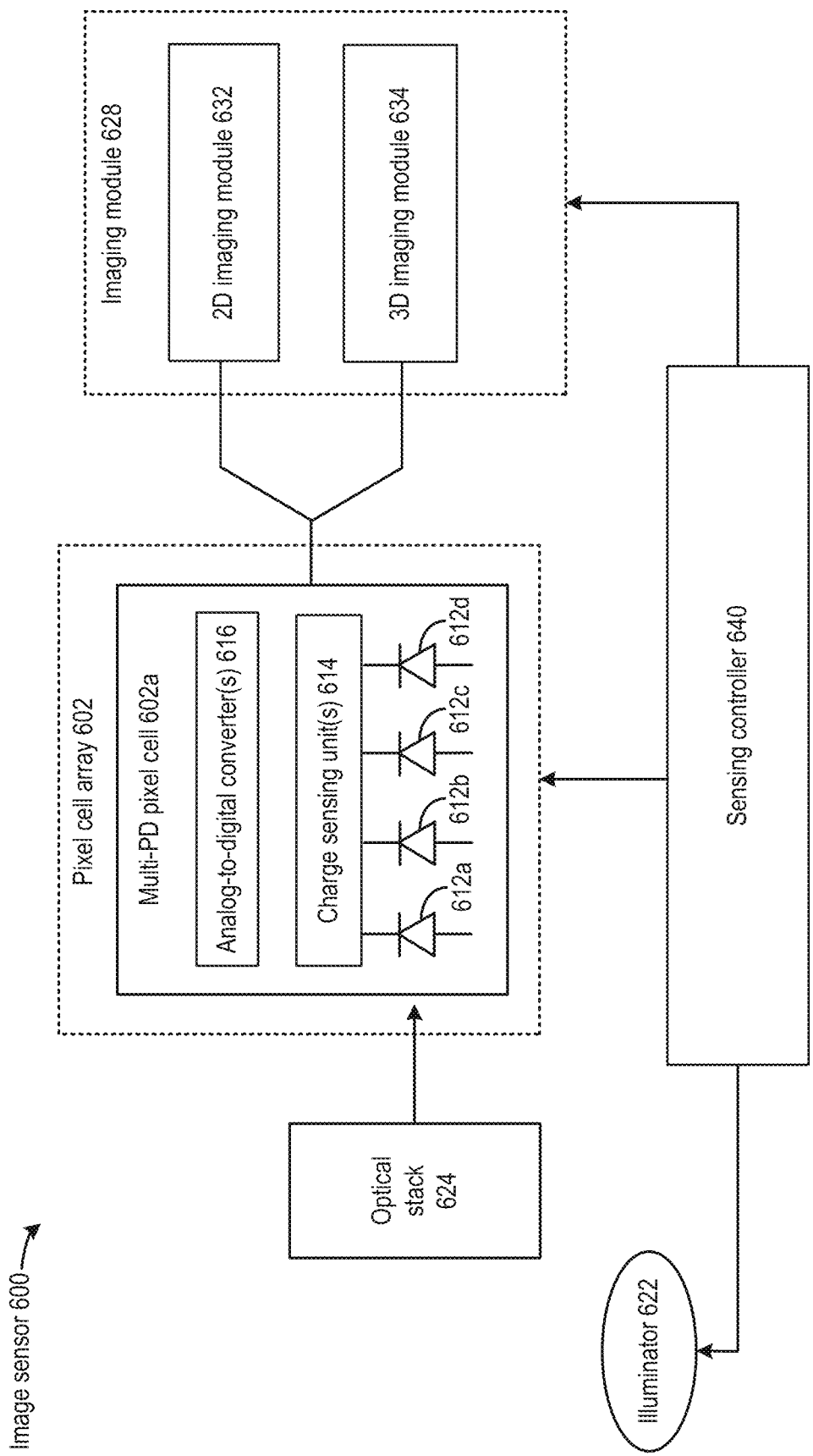
FIG. 6A, FIG. 6B, and FIG. 6C illustrate block diagrams of examples of an image sensor.
Figure 6B:
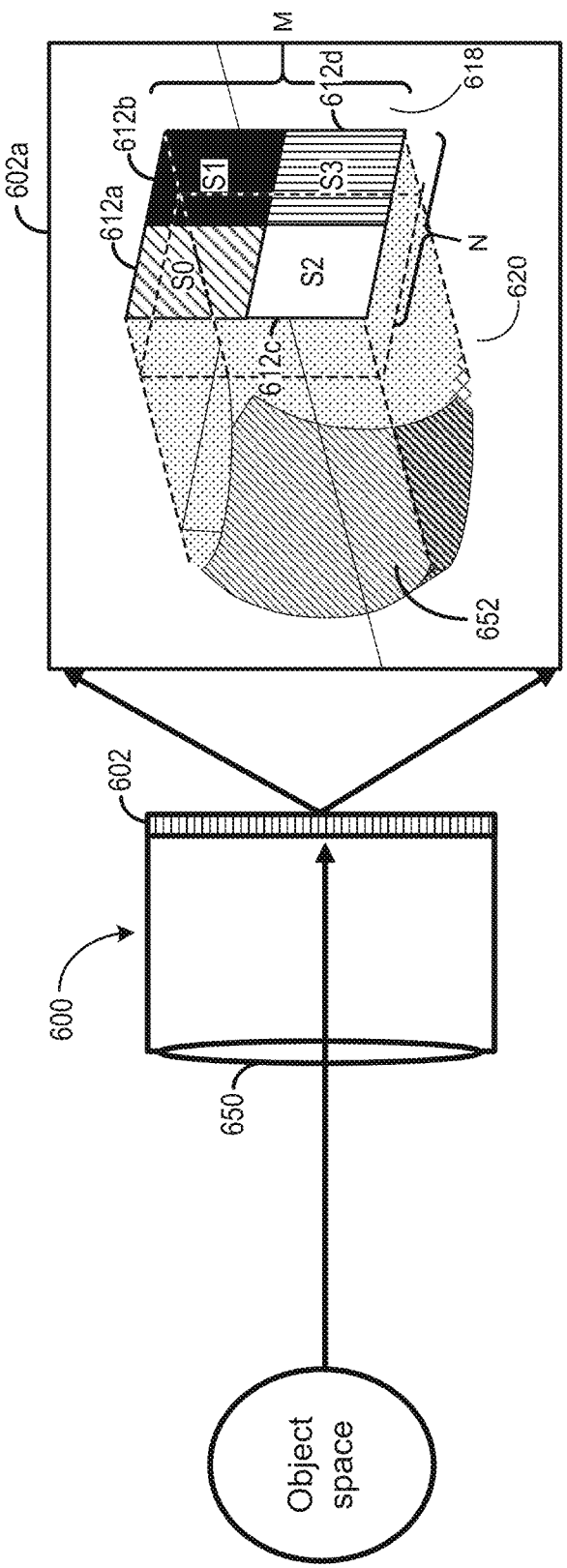

FIG. 6A and FIG. 6B illustrate an example of an image sensor 600. Image sensor 600 can be part of near-eye display 100, and can provide 2D- and 3D-image data to control circuitries 510 of FIG. 5 to control the display content of near-eye display 100. As shown in FIG. 6A, image sensor 600 may include an array of pixel cells 602 including pixel cell 602a. Pixel cell 602a can include a plurality of photodiodes 612 including, for example, photodiodes 612a, 612b, 612c, and 612d, one or more charge sensing units 614, and one or more analog-to-digital converters 616. The plurality of photodiodes 612 can convert different frequency components of incident light to charge. For example, photodiode 612a-612c can correspond to different visible light channels, in which photodiode 612a can convert a visible blue component (e.g., a wavelength range of 450-490 nanometers (nm)) to charge. Photodiode 612b can convert a visible green component (e.g., a wavelength range of 520-560 nm) to charge. Photodiode 612c can convert a visible red component (e.g., a wavelength range of 635-700 nm) to charge. Moreover, photodiode 612d can convert an infrared component (e.g., 700-1000 nm) to charge. Each of the one or more charge sensing units 614 can include a charge storage device and a buffer to convert the charge generated by photodiodes 612a-612d to voltages, which can be quantized by one or more ADCs 616 into digital values. The digital values generated from photodiodes 612a-612c can represent the different visible light components of a pixel, and each can be used for 2D sensing in a particular visible light channel. Moreover, the digital value generated from photodiode 612d can represent the infrared light component of the same pixel and can be used for 3D sensing. Although FIG. 6A shows that pixel cell 602a includes four photodiodes, it is understood that the pixel cell can include a different number of photodiodes (e.g., two, three, four, five, etc.).

In some examples, image sensor 600 may also include an illuminator 622, an optical filter 624, an imaging module 628, and a sensing controller 640. Illuminator 622 may be an infrared illuminator, such as a laser or a light emitting diode (LED), that can project infrared light for 3D sensing. The projected light may include, for example, structured light or light pulses. Optical filter stack 624 may include a camera lens, as well as an array of optical elements overlaid on the plurality of photodiodes 612a-612d of each pixel cell, including pixel cell 602a. Each optical element can include a filter element to set a wavelength range of incident light received by each photodiode of pixel cell 602a. For example, a filter element over photodiode 612a may transmit the visible blue light component while blocking other components, a filter element over photodiode 612b may transmit the visible green light component, a filter element over photodiode 612c may transmit the visible red light component, whereas a filter element over photodiode 612d may transmit the infrared light component.

Image sensor 600 further includes an imaging module 628. Imaging module 628 may further include a 2D imaging module 632 to perform 2D imaging operations and a 3D imaging module 634 to perform 3D imaging operations. The operations can be based on digital values provided by ADCs 616. For example, based on the digital values from each of photodiodes 612a-612c, 2D imaging module 632 can generate an array of pixel values representing an intensity of an incident light component for each visible color channel, and generate an image frame for each visible color channel. Moreover, 3D imaging module 634 can generate a 3D image based on the digital values from photodiode 612d. In some examples, based on the digital values, 3D imaging module 634 can detect a pattern of structured light reflected by a surface of an object, and compare the detected pattern with the pattern of structured light projected by illuminator 622 to determine the depths of different points of the surface with respect to the pixel cell array. For detection of the pattern of reflected light, 3D imaging module 634 can generate pixel values based on intensities of infrared light received at the pixel cells. As another example, 3D imaging module 634 can generate pixel values based on time-of-flight of the infrared light transmitted by illuminator 622 and reflected by the object.

FIG. 6B illustrates additional details of image sensor 600. As shown in FIG. 6B, image sensor 600 further includes a camera lens 650 and pixel cell array 602, including pixel cell 602a. Pixel cell 602a can be configured as a super-pixel. Camera lens 650 can be part of optical stack 624. Here, each "super-pixel" refers to a sensor device that may comprise an N×M array of neighboring (i.e., adjacent) sub-pixels, each sub-pixel having a photodiode for converting energy of light of a particular wavelength from a particular spot into a signal, so that the output of each sub-pixel correspond to the same pixel. In a case where the sub-pixels measure both visible light and infrared light, the outputs of the sub-pixels can support collocated 2D/3D sensing. In FIG. 6B, sub-pixels S0, S1, S2, and S3 including, respectively, photodiodes 612a, 612b, 612c, and 612d of FIG. 6A are shown.

A shared optical element, such as a microlens 652, which can also be part of array of optical stack 624, may be positioned between the scene and photodiodes 612a, 612b, 612c, and 612d. In some examples, each super-pixel may have its own microlens. Microlens 652 may be significantly smaller in size than camera lens 650, which serves to accumulate and direct light for the entire image frame toward pixel cell array 602. Microlens 652 directs light from a particular location in the scene to photodiodes 612a-612d. In this manner, the sub-pixels of a super-pixel can simultaneously sample light from the same spot of a scene, and each sub-pixel can generate a corresponding pixel value in an image frame. In some examples, the shared optical element may include other types of optical elements, such as metalens, liquid crystal hologram, etc.

Figure 6C:
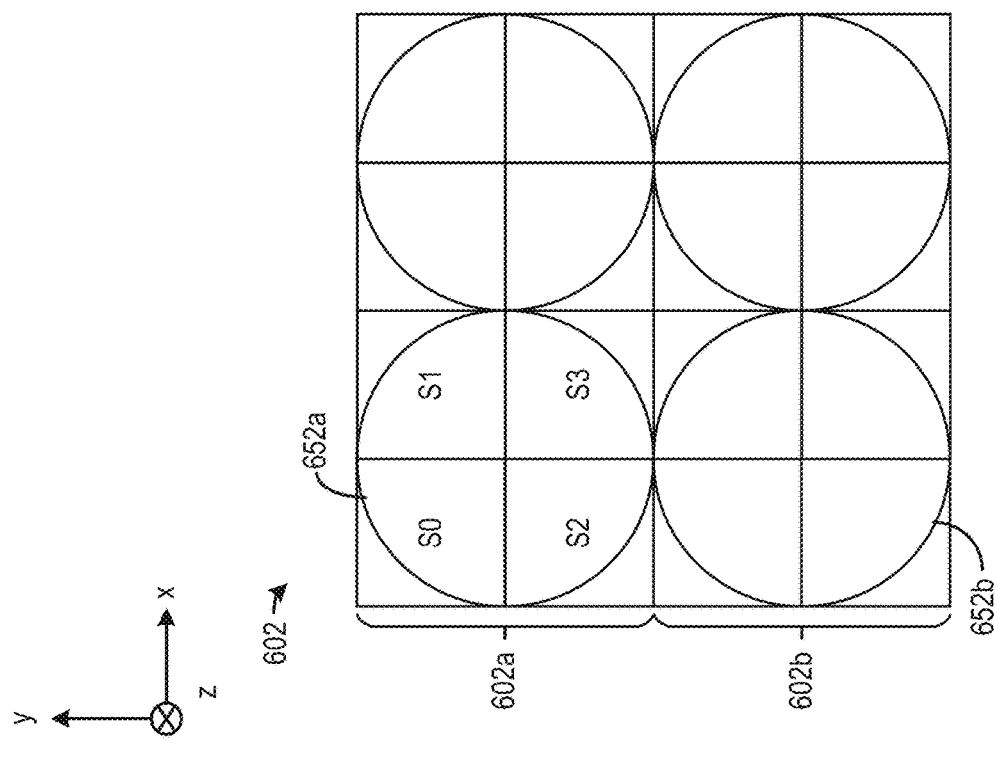
Figure 6C:
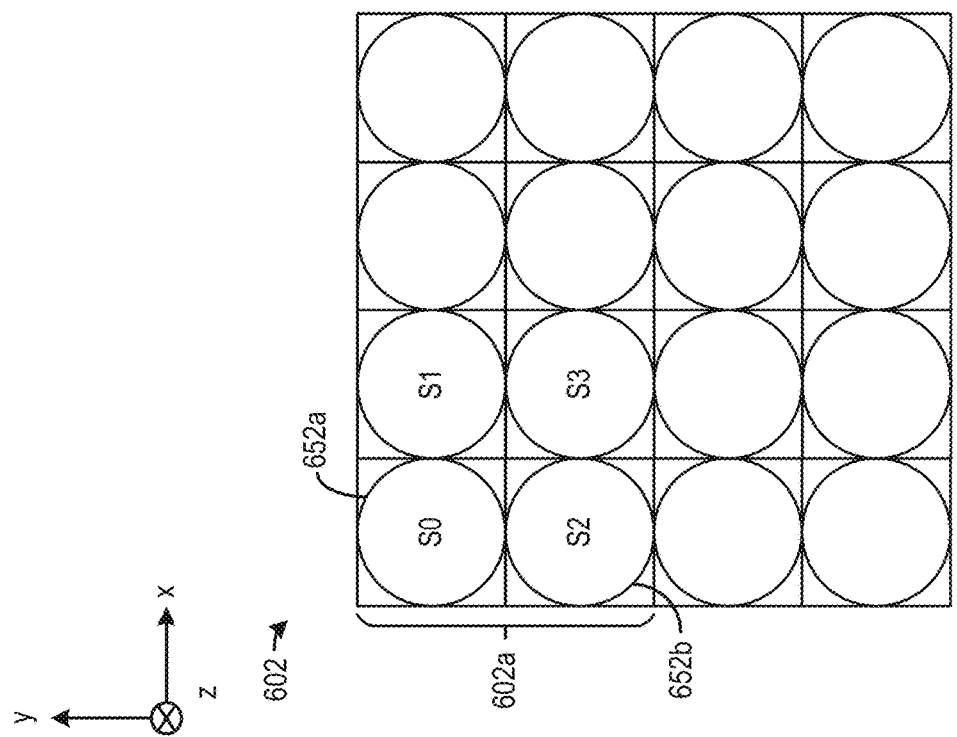

FIG. 6C illustrates examples arrangements of microlens 652. In some examples, one microlens 652 can be positioned over one sub-pixel. For example, microlens 652a can be positioned over sub-pixel S0 of pixel cell 602a, whereas microlens 652b can be positioned over sub-pixel S2 of pixel cell 602a. As another example, as shown on the right of FIG. 6C, one microlens 652 can be positioned over sub-pixels of a pixel cell. For example, microlens 652a can be positioned over sub-pixels S0, S1, S2, and S3 of pixel cell 602a, whereas microlens 652b cam be positioned over pixel cell 602b.

Figure 7A:
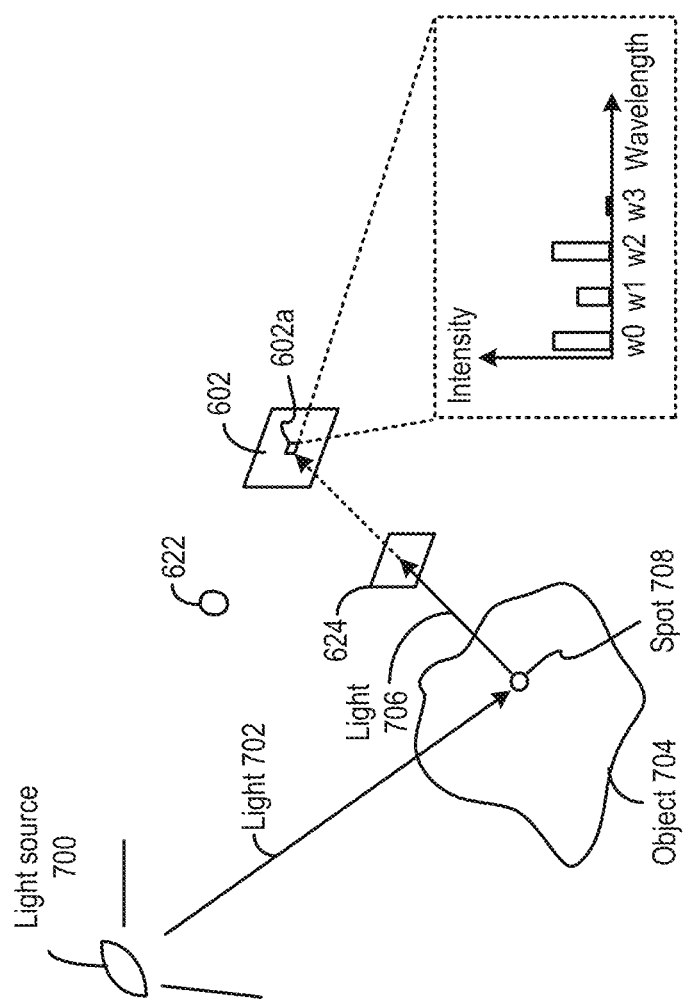
FIG. 7A, FIG. 7B, and FIG. 7C illustrate operations for determining light intensities of different frequency ranges by the examples of image sensor of FIGS. 6A-6C.
Figure 7B:
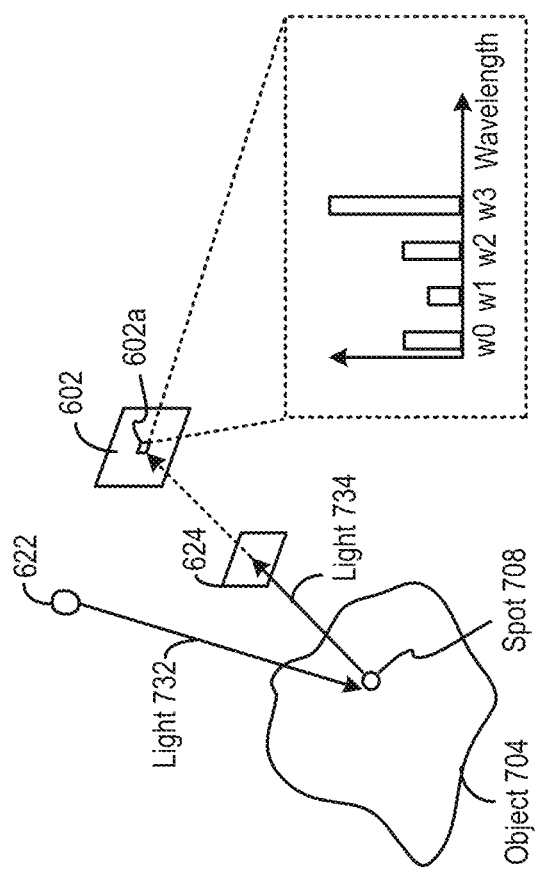
Figure 7C:
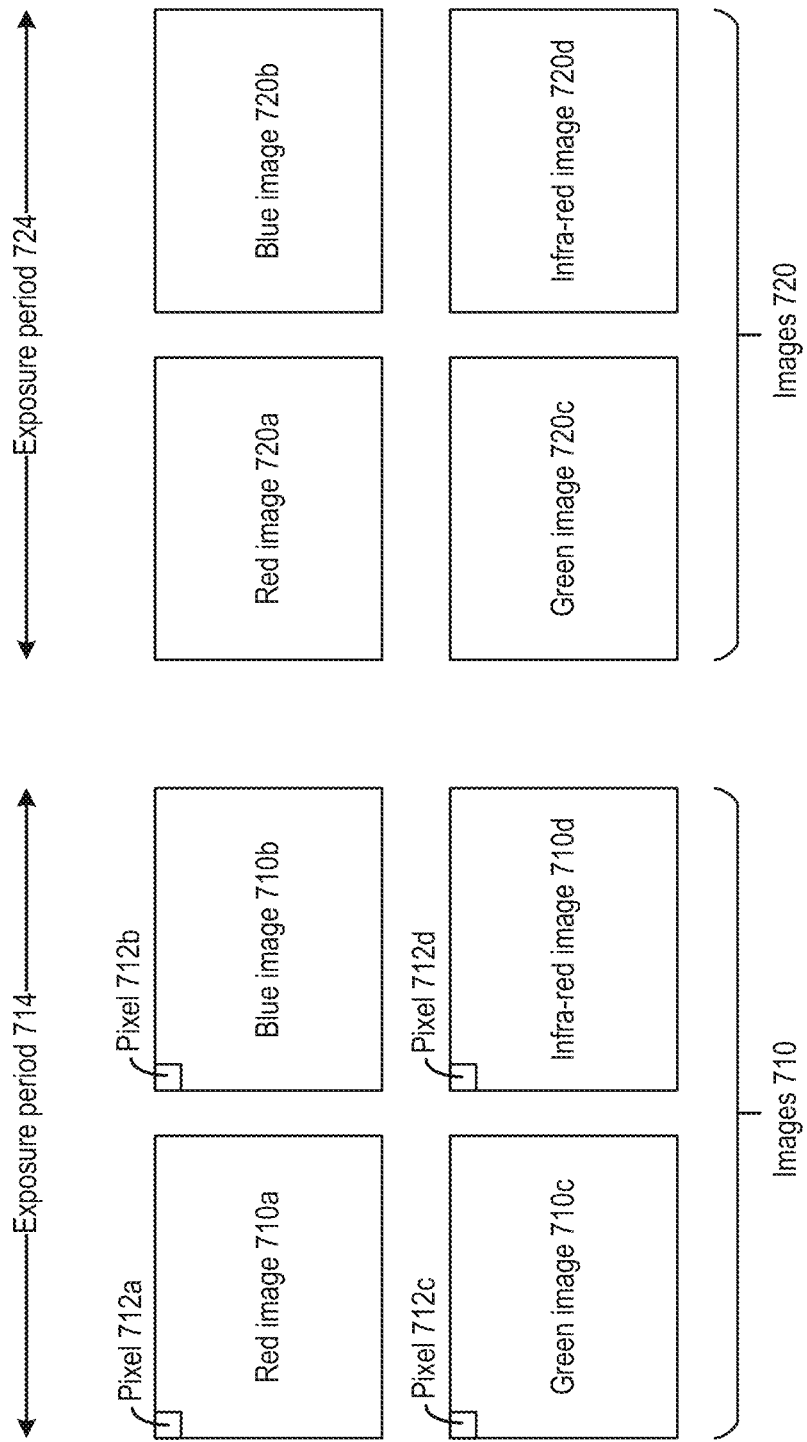

Image sensor 600 further includes a sensing controller 640 to control different components of image sensor 600 to perform 2D and 3D imaging of an object. Reference is now made to FIGS. 7A-FIG. 7C, which illustrate examples of operations of image sensor 600 for 2D and 3D imaging. FIG. 7A illustrates an example of operations for 2D imaging. For 2D imaging, pixel cell array 602 can detect visible light in the environment including visible light reflected off an object. For example, referring to FIG. 7A, visible light source 700 (e.g., a light bulb, the sun, or other sources of ambient visible light) can project visible light 702 onto an object 704. Visible light 706 can be reflected off a spot 708 of object 704. Visible light 706 can also include the ambient infrared light component. Visible light 706 can be filtered by optical filter array 624 to pass different components of visible light 706 of wavelength ranges w0, w1, w2, and w3 to, respectively, photodiodes 612a, 612b, 612c, and 612d of pixel cell 602a. Wavelength ranges w0, w1, w2, and w3 correspond to, respectively, blue, green, red, and infrared. As shown in FIG. 7A, as the infrared illuminator 622 is not turned on, the intensity of infrared component (w3) is contributed by the ambient infrared light and can be very low. Moreover, different visible components of visible light 706 can also have different intensities. Charge sensing units 614 can convert the charge generated by the photodiodes to voltages, which can be quantized by ADCs 616 into digital values representing the red, blue, and green components of a pixel representing spot 708. Referring to FIG. 7C, after the digital values are generated, sensing controller 640 can control 2D imaging module 632 to generate, based on the digital values, sets of images including a set of images 710, which includes a red image frame 710a, a blue image frame 710b, and a green image frame 710c, each representing one of red, blue, or green color image of a scene captured with the same exposure period 714. Each pixel from the red image (e.g., pixel 712a), from the blue image (e.g., pixel 712b), and from the green image (e.g., pixel 712c) can represent visible components of light from the same spot (e.g., spot 708) of a scene. A different set of images 720 can be generated by 2D imaging module 632 in a subsequent exposure period 724. Each of red image 710a, blue image 710b, and green image 710c can represent the scene in a specific color channel and can be provided to an application to, for example, extract image features from the specific color channel. As each image represents the same scene and each corresponding pixel of the images represent light from the same spot of the scene, the correspondence of images between different color channels can be improved.

Furthermore, image sensor 600 can also perform 3D imaging of object 704. Referring to FIG. 7B, sensing controller 610 can control illuminator 622 to project infrared light 732, which can include a light pulse, structured light, etc., onto object 704. Infrared light 732 can have a wavelength range of 700 nanometers (nm) to 1 millimeter (mm). Infrared light 734 can reflect off spot 708 of object 704 and can propagate towards pixel cell array 602 and pass through optical filter 624, which can provide the infrared component (of wavelength range w3) to photodiode 612d to convert to charge. Charge sensing units 614 can convert the charge to a voltage, which can be quantized by ADCs 616 into digital values. Referring to FIG. 7C, after the digital values are generated, sensing controller 640 can control 3D imaging module 634 to generate, based on the digital values, an infrared image 710d of the scene as part of images 710 captured within exposure period 714. As infrared image 710d can represent the same scene in the infrared channel and a pixel of infrared image 710d (e.g., pixel 712d) represents light from the same spot of the scene as other corresponding pixels (pixels 712a-712c) in other images within images 710, the correspondence between 2D and 3D imaging can be improved as well.

One challenge of implementing an image sensor is how to enable the photodiodes to efficiently absorb light to generate the charge. A low absorption efficiency means a photodiode will need to be exposed to light of a higher intensity to generate a certain quantity of charge, which can reduce the signal-to-noise ratio (SNR). Specifically, the output of the image sensor typically includes a signal component attributed to the detected light from the photodiode, as well as a noise component attributed to noise introduced by other components of the image sensor (e.g., electronic noise, dark charge). If the absorption efficiency is low, and if the detected light has a low intensity, the output of the image sensor may include a large noise component relative to the signal component attributed to the detected light, and the signal component may become indistinguishable from the noise component. The image sensor's performance in measuring the low intensity light may become degraded as a result. Therefore, it is desirable to increase the absorption efficiency to improve the performance of the image sensor.

Figure 8A:
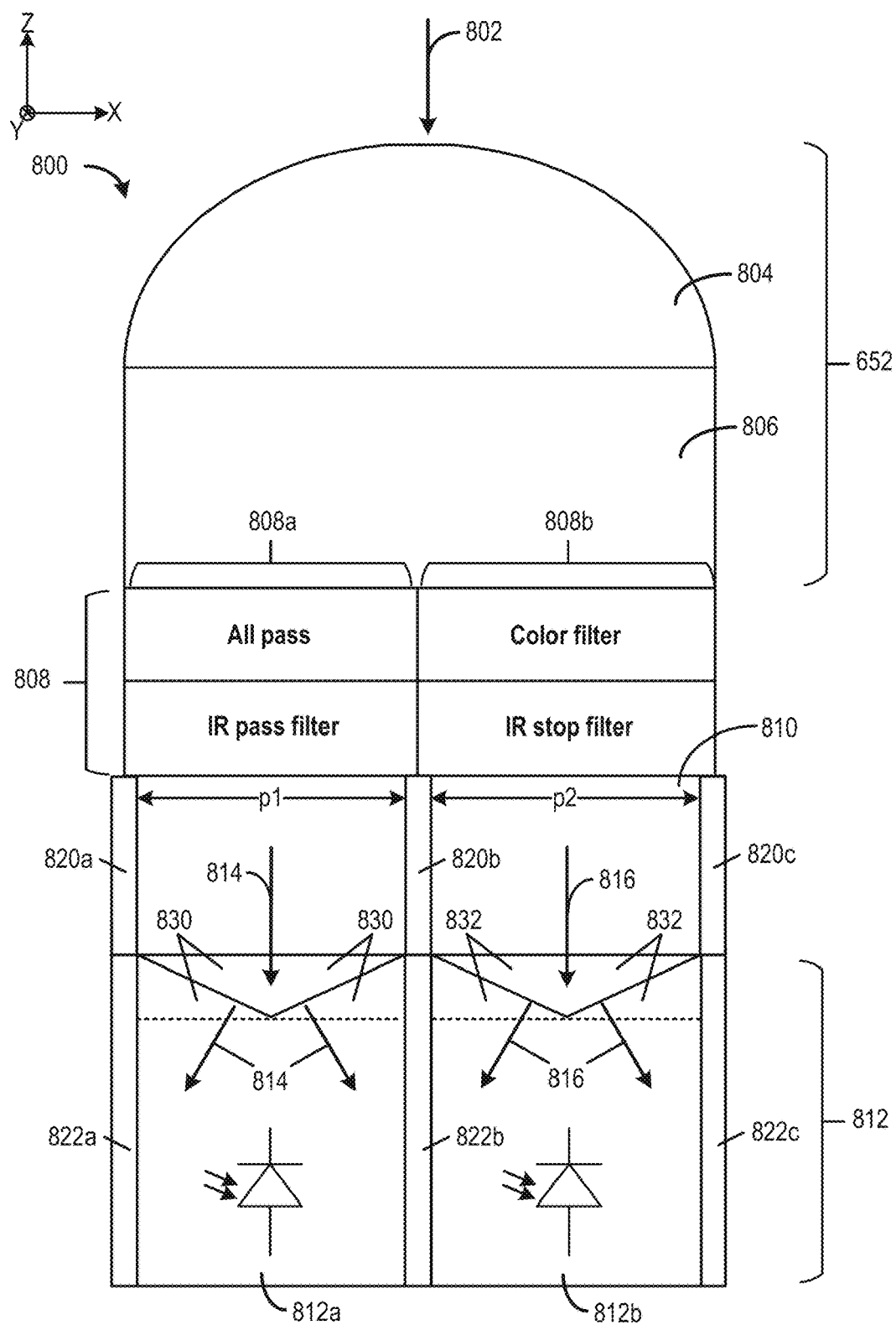
FIG. 8A, FIG. 8B, and FIG. 8C illustrate examples of a multi-spectral pixel cell that can be part of the image sensor of FIGS. 6A-6C.

FIG. 8A-FIG. 8E present additional components of a multi-spectral pixel cell 800, which can be part of pixel cell array 602, to provide enhanced absorption efficiency of light. As shown in FIG. 8A, pixel cell 800 can be implemented as a multi-layer semiconductor sensor device. In the orientation shown in FIG. 8A, received light 802 travels from the top of pixel cell 800, through microlens 652 and various layers along the Z-axis, to reach a plurality of sub-pixels located at the bottom of the sensor device. Pixel cell 800 comprises multiple layers, including microlens 652 with a microlens top layer 804, a microlens under layer 806, a filter layer 808, an oxide (e.g., silicon dioxide) layer 810, and a sub-pixel 812 with sub-pixels 812a and 812b. In a case where pixel cell 800 includes four sub-pixels as shown in FIG. 6A-FIG. 6C, sub-pixel 812 may further includes sub-pixels 812c and 812d (not shown in FIG. 8A) adjacent to sub-pixels 812a and 812b.

Specifically, filter layer 808 may include a first filter 808a over sub-pixel 812a and a second filter 808b over sub-pixel 812b, which are positioned adjacent to each other along the X/Y-axis. In a case where sub-pixel 812 includes sub-pixels 812c and 812d, filter layer 808 may further include a third filter 808c over sub-pixel 812c and a fourth filter 808d over sub-pixel 812d (not shown in the FIG. 8A). First filter 808a can be configured to selectively pass light within the infrared frequency range (430 THz-300 GHz), and can include an all pass element stacked over an infrared pass filter element along the Z-axis. Moreover, second filter 808b can be configured to selectively pass visible light of a particular color (e.g., red, green, or blue), and can include a color filter element stacked over an infrared stop filter element along the Z-axis to select the color of the visible light and to block the infrared light. Upon being filtered by filter layer 808, light can propagate along the vertical axis (the Z-axis) towards sub-pixels 812.

Pixel cell 800 also includes sub-pixels 812, which can be implemented in a semiconductor substrate, such as a silicon substrate. Each sub-pixel can include a photosensitive region in which a photodiode is formed to detect the light filtered by filter layer 808. For example, sub-pixel 812a is below first filter 808a to convert infrared light component 814 of light 802 to charge, whereas sub-pixel 812b is below second filter 808b to convert a visible light component 816 of light 802 to charge. As such, infrared light component 814 can be an in-band light component for sub-pixel 812a, whereas visible light component 816 can be an in-band light component for sub-pixel 812b.

In addition, pixel cell 602a may include insulation structures to reduce cross-talks, in which an out-of-band light component enters a sub-pixel from a neighboring sub-pixel and mixes with the in-band component. As a result of cross-talk, the charge generated by the photodiode of the sub-pixel no longer only represents the in-band light component, which introduces errors in the sub-pixel output. For example, for sub-pixel 812a, the in-band light component is infrared light component 814. Due to cross-talk, out-of-band light components, such as visible light component 816, may reach sub-pixel 812a. Likewise, for sub-pixel 812b, the in-band light component is visible light component 816, but out-of-band light components such as infrared light component 814 may reach sub-pixel 812b. To reduce cross-talks, oxide layer 810 may include one or more metallic-based insulation structures, such as a backside metallization (BSM) structures 820 (e.g., 820a, 820b, and 820c), to prevent a light component from filter layer 808 targeted at a sub-pixel from propagating into a neighboring sub-pixel or a neighboring pixel cell. The BSM structures may include an absorptive metal material to avoid undesired reflections. In some examples, an anti-reflection coating can be applied to the BSM to reduce undesired light reflections.

In addition, sub-pixels 812 may include one or more silicon-based insulation structures, such as deep trench isolations (DTI) 822 (e.g., 822a, 822b, and 822c), formed as sidewalls of the sub-pixel. The DTI can prevent light components 814 and 816 from propagating between sub-pixels 812a and 812b to reduce the cross-talks between sub-pixels. In some examples, DTI 822 can be filled with silicon dioxide. In some examples, DTI 822 can also be filed with a metallic material, a polysilicon, etc. In some examples, DTI 822 can be coated with a reflective layer. As to be described below, DTI 822 can internally reflect light components 814 and 816 within, respectively, sub-pixels 812a and 812b to extend the propagation paths of the in-band light components within the sub-pixels to improve the absorption efficiency of the in-band light components by the photodiodes of the sub-pixels.

Further, pixel cell 800 further includes oxide layer 810, which can include first optical structure 830 and second optical structure 832 positioned over, respectively, sub-pixels 812a and 812b. First optical structure 830 and second optical structure 832 are configured to propagate light towards, respectively, sub-pixels 812a and 812b along predetermined propagation directions. First optical structure 830 and second optical structure 832 can form a high absorption (HA) layer to enhance the absorption of the light by the photodiodes of sub-pixels 812a and 812b. Specifically, first optical structure 830 can selectively steer light component 814, based on its wavelength, away from the vertical axis (the Z-axis) and towards DTIs 822a and 822b, which can reflect light component 814 internally within sub-pixel 812a to extend the propagation distance of light component 814. Moreover, second optical structure 832 can selectively steer light component 816, based on its wavelength, away from the vertical axis (the Z-axis) and towards DTIs 822b and 822c, which can reflect light component 816 internally within sub-pixel 812b to extend the propagation distance of light component 816. Such arrangements can improve the absorption efficiency of the in-band light components by the photodiodes of the sub-pixels.

Figure 8B:
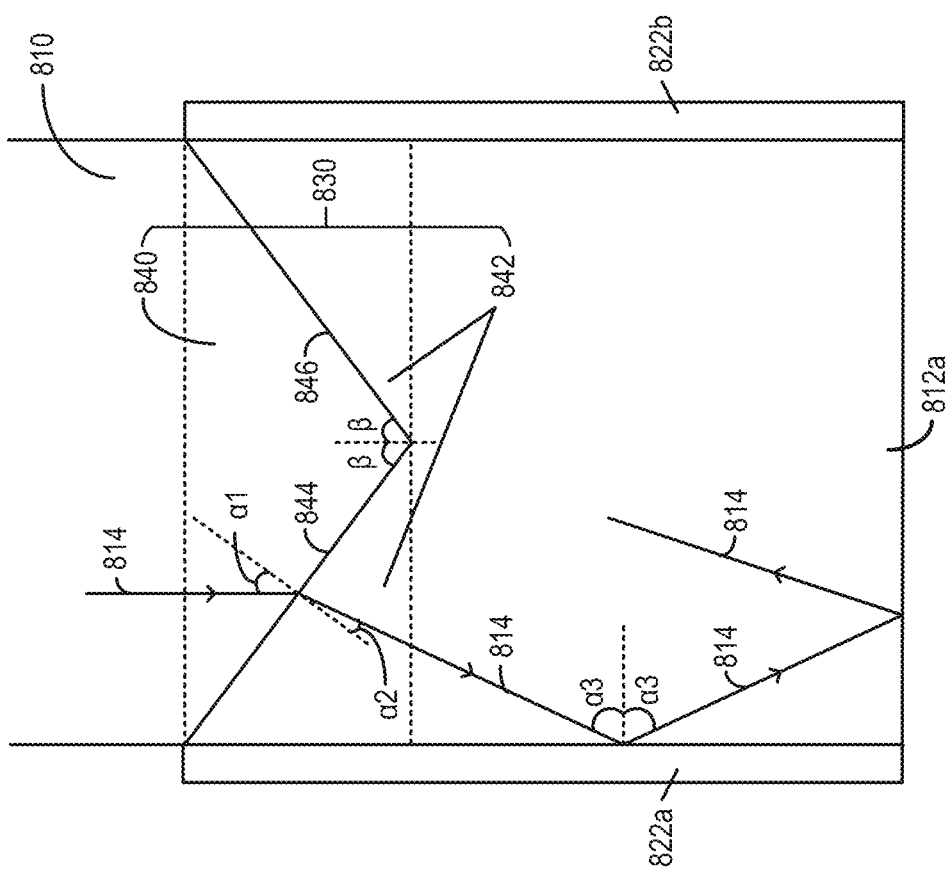

First optical structure 830 and second optical structure 832 can steer their respective in-band light components based on various mechanisms. One example mechanism is refraction. The optical structures can steer the in-band light components based on refraction when the pitch size of the optical structure (denoted as p1 and p2 in FIG. 8A) is smaller than (e.g., 50%-70%) of the wavelength of the in-band light component to be steered. Specifically, referring to FIG. 8B, first optical structure 830 can include complimentary protrusion structures 840 and 842. Protrusion structure 840 can be an extension of oxide layer 810, whereas protrusion structure 842 can be an extension of sub-pixel 812. Protrusion structures 840 and 842 interface with each other at one or more sloped light transmission surfaces, such that sloped light transmission surfaces 844 and 846. Each sloped surface forms a slope angle β with the Z-axis. As a result, light component 814 can reach the sloped surface at an incident angle of α1, with respect to the normal axis of the sloped light transmission surface. Due to the different refractive indices of silicon dioxide (of oxide layer 810) and silicon (of sub-pixel 814), light component 814 can be refracted at the sloped light transmission surface at a refraction angle α2, and refracted light component 814 can reach a sidewall of sub-pixel 812a having DTI 820a at an incident angle of α3 with respect to the normal axis of DTI 820a. If the incident angle α3 exceeds a critical angle θc, refracted light component 814 can undergo total internal reflection at DTI 820a instead of passing through DTI 820a. As shown in FIG. 8B, light component 814 can undergo additional total internal reflections within the photodiode (e.g., on a bottom surface of sub-pixel 812a, on DTI 820b of sub-pixel 812a). Due to the reflections, the propagation path of light component 814 within sub-pixel 812a can be extended, which can improve the absorption efficiency of the light by the photodiode of sub-pixel 812a. In some examples, the sloped light transmission surfaces can be coated with a layer of anti-reflection material to prevent the reflection of light components 814 and 816 on the light transmission surfaces, to further improve the absorption efficiency.

The geometry of first optical structure 830, such as slope angle β, can be determined such that incident angle of α3 exceeds the critical angle θc. Specifically, refraction angle α2 can be related to incident angle α1 based on Snell's law as follows:

$$n1 \times \sin(\alpha 1) = n2 \times \sin(\alpha 2). \quad \text{(Equation 1)}$$

Equation 1 can be rewritten as:

$$\alpha 2 = \sin^{-1}\left(\frac{n1 \times \sin(\alpha 1)}{n2}\right). \quad \text{(Equation 2)}$$

In Equation 1, n1 is the refractive index of silicon dioxide of oxide layer 810, whereas n2 is the refractive index of sub-pixel 812a (e.g., the refractive index of silicon).

In addition, refraction angle α2 can be related to incident angle α3 and slope angle β as follows:

$$\beta = \alpha 3 + \alpha 2 = > \alpha 3 = \beta - \sin^{-1}\left(\frac{n1 \times \sin(\alpha 1)}{n2}\right). \quad \text{(Equation 3)}$$

The critical angle θc can be determined based on Snell's law and based on the refractive indices of DTI 820a and of sub-pixel 812a as follows:

$$\theta c = \sin^{-1}\left(\frac{n1}{n2}\right). \quad \text{(Equation 4)}$$

In Equation 4, n1 is the refractive index of DTI 820a (if it is made of silicon dioxide), whereas n2 is the refractive index of sub-pixel 812a. The slope angle β can be determined based on Equations 3 and 4 to satisfy the following relationship, for a range of incident angles α1:

$$\alpha 3 > \sin^{-1}\left(\frac{n1}{n2}\right) = \; > \beta - \sin^{-1}\left(\frac{n1 \times \sin(\alpha 1)}{n2}\right) > \sin^{-1}\left(\frac{n1}{n2}\right). \quad \text{(Equation 5)}$$

In some examples, first optical structure 830 and second optical structure 832 may have the same optical properties. For example, first optical structure 830 and second optical structure 832 may have the same material (e.g., silicon dioxide) and hence have the same refractive index. Moreover, the protrusion structures of the optical structures may have the same geometry (e.g., same slope angle β). Such arrangements, however, may lead to an optical structure that allows light having a certain incident wavelength range (before refraction) to undergo total internal reflection on the DTI, but not light of a different wavelength range. Specifically, the refractive index of a material can be a function of the incident wavelength, which leads to the material having different refractive indices for light of different wavelength ranges. Because of the dependency of refractive index on incident wavelength, the critical angle for total internal reflection may be different for light components 814 and 816. The following table provides the refractive indices of silicon, silicon dioxide, and critical angle for different incident wavelengths:

TABLE 1

| Wavelength | Silicon dioxide refractive index | Silicon refractive index | Critical angle θc |
|---|---|---|---|
| 500 nm | 1.46 | 4.32 | 19.7 |
| 940 nm | 1.53 | 3.55 | 25 |

Figure 8C:
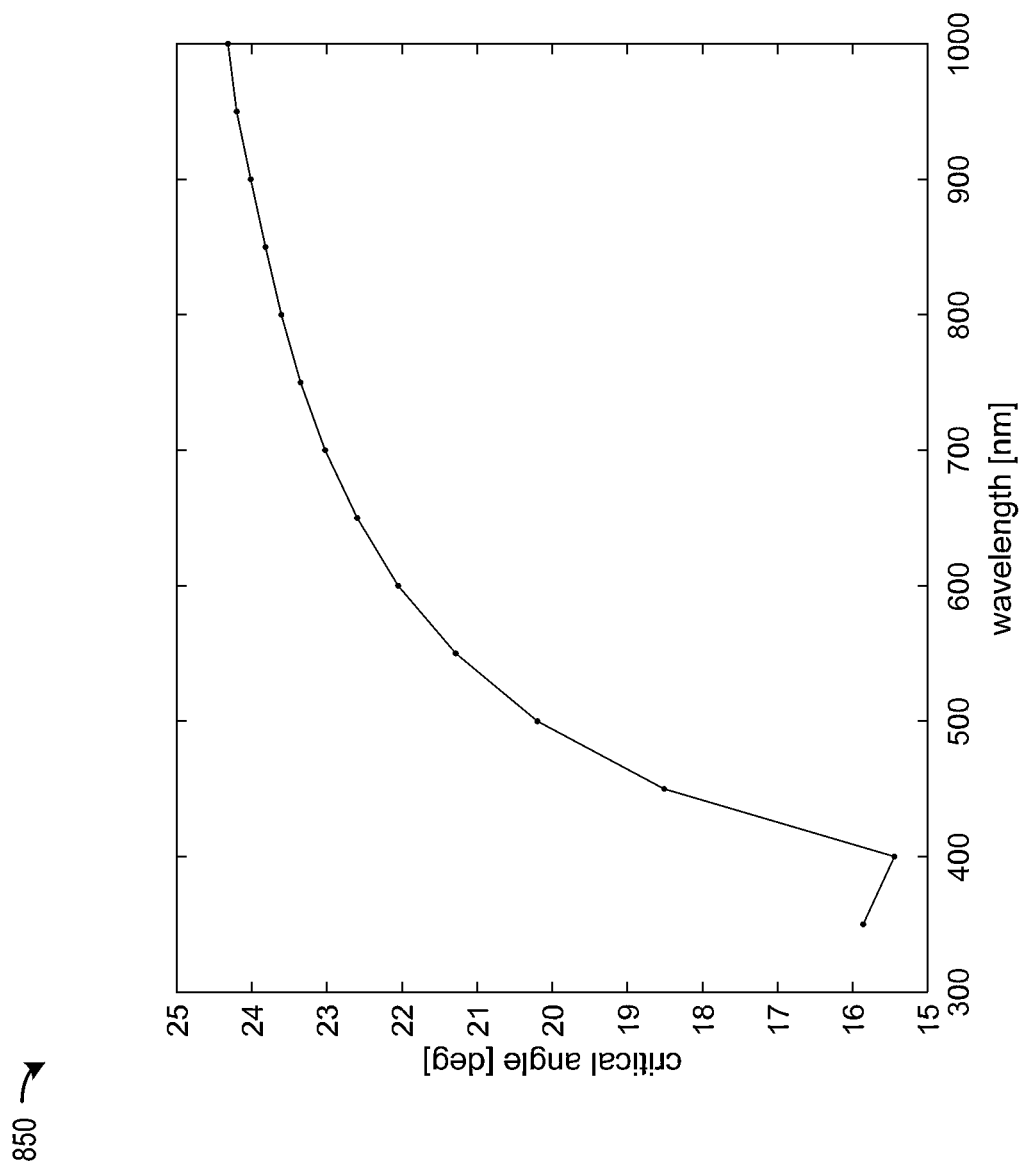

FIG. 8C provides a chart 850 that illustrates the change of critical angle θc, with respect to incident wavelength. Referring to Table 1 and FIG. 8C, a value of β that satisfies Equation 5 for light of wavelength 500 nm (e.g., blue visible light, such as light component 816) may not satisfy Equation 5 for light of wavelength 940 nm (e.g., infrared light, such as light component 814), as the critical angle for infrared light is much larger. On the other hand, a value of β that satisfies Equation 5 for light of wavelength 940 nm may not satisfy Equation 5 for light of wavelength 500 nm for the entire range of incident angle α1. Therefore, if first optical structure 830 and second optical structure 832 have identical optical properties, the optical structures may be unable to enhance the absorption efficiency for light components of a particular wavelength range.

Another example mechanism by which first optical structure 830 and second optical structure 832 can steer their in-band light component can be based on diffraction. Diffraction can occur when light bends after passing through an optical opening formed by an optical structure, such as first optical structure 830 or second optical structure 832. Due to the diffraction and/or refraction of the light by the optical structure 830 and 832, as well as reflection of the light by DTI 822a and 822b, the optical path traversed by the light can increase, which can increase the absorption of the light by the sub-pixel.

Figure 9A:
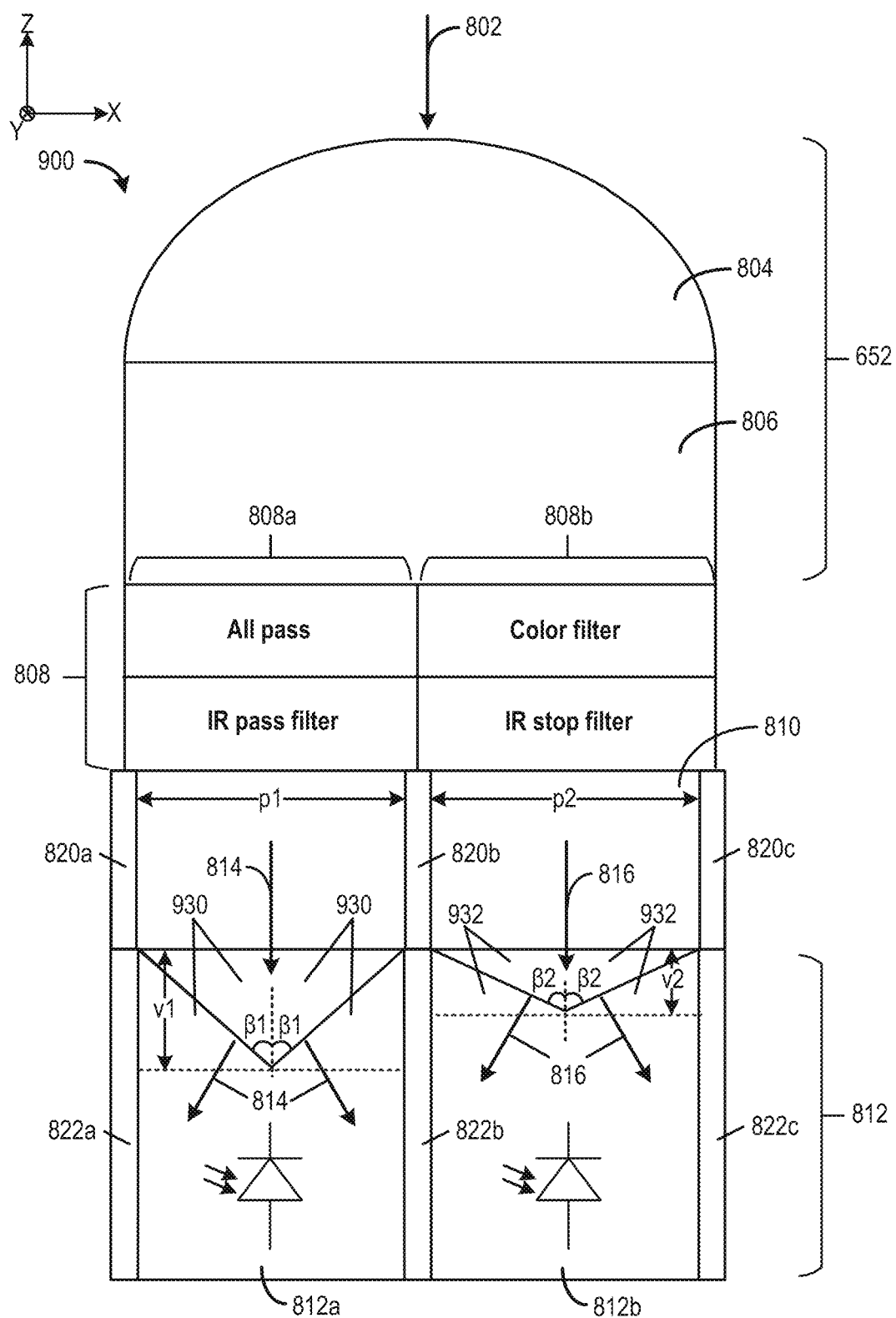
FIG. 9A, FIG. 9B, and FIG. 9C illustrate examples of a multi-spectral pixel cell that can be part of the image sensor of FIGS. 6A-6C.
Figure 9B:
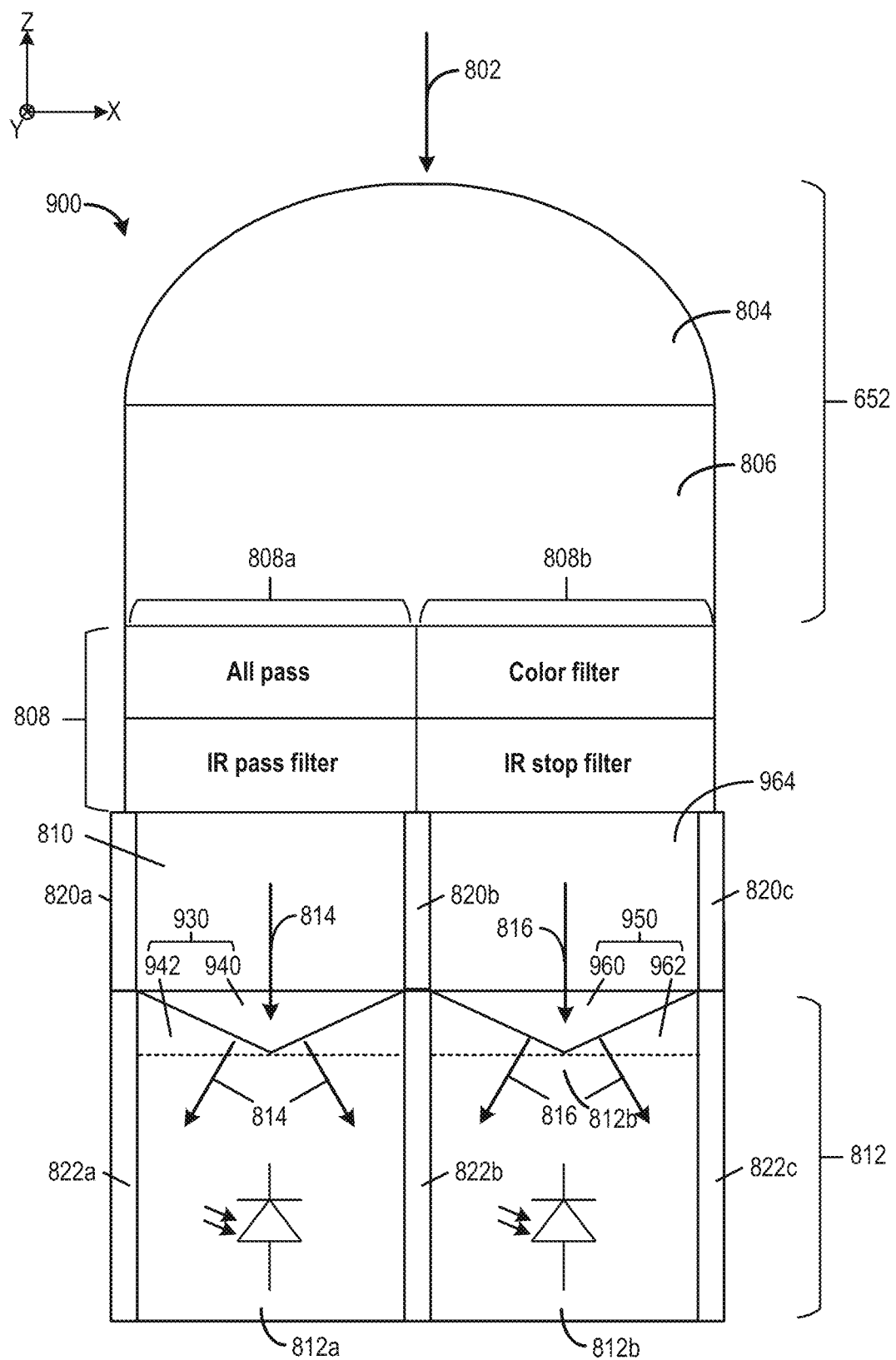
Figure 9C:
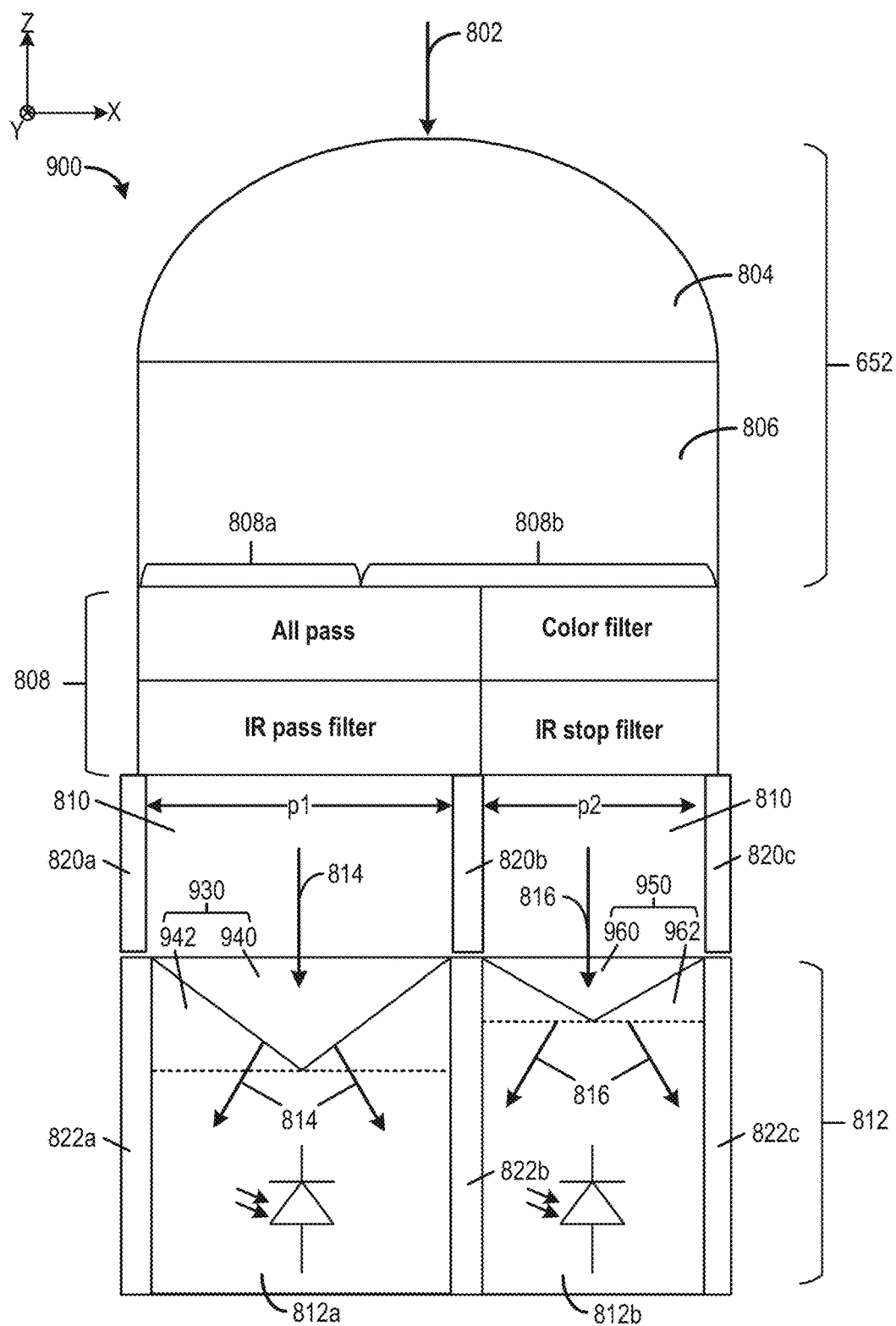

FIG. 9A, FIG. 9B, and FIG. 9C illustrate examples of a multi-spectral pixel cell 900. As in multi-spectral pixel cell 800 of FIG. 8A-FIG. 8E, pixel cell 900 can be implemented as a multi-layer semiconductor sensor device and include microlens 652, filter layer 808, oxide layer 810, and sub-pixel 812 including sub-pixels 812a and 812b.

In addition, pixel cell 900 further includes a first optical structure 930 positioned between filter element 808a and sub-pixel 812a, and a second optical structure 932 positioned between filter element 808b and sub-pixel 812b. First optical structure 930 and second optical structure 932 can form a high absorption (HA) layer to enhance the absorption of an in-band light component by the respective photodiode of sub-pixels 812a and 812b. First optical structure 930 and second optical structure 932 can have different optical properties, where the optical property of each optical structure is configured according to the wavelength/frequency of the in-band component. For example, the optical property of first optical structure 930 is configured based on the incident wavelength (or frequency) of first light component 814 (e.g., infrared light), whereas the optical property of second optical structure 932 is configured based on the incident wavelength of second light component 816 (e.g., visible light).

As described above, first optical structure 930 and second optical structure 932 can be configured to steer the respective in-band light components by refraction, when the pitch size of the optical structures is smaller than (e.g., 50%-70%) of the wavelength of the in-band light component to be steered. The refractive properties of first optical structure 930 and second optical structure 932 can be tailored based on the wavelengths of the respective in-band light component of each photodiode to maximize the reflection of the in-band light component at the sidewalls, which in turn can increase the internal reflection and absorption of the in-band light component within the photodiode. The refractive properties can be configured in various ways, such as by geometry and material. For example, in FIG. 9A, the light transmission surfaces of first optical structure 930 and second optical structure can have different slope angles. The light transmission surfaces of first optical structure 930 can form a slope angle β1, with respect the Z-axis, whereas the light transmission surfaces of second optical structure 932 can form a slope angle β2, with respect the Z-axis. Slope angles β1 and β2 can be determined to satisfy the relationships below, based on Equation 5:

$$\beta 1 - \sin^{-1}\left(\frac{n1\_\lambda 1 \times \sin(\alpha 1)}{n2\_\lambda 1}\right) > \sin^{-1}\left(\frac{n1\_\lambda 1}{n2\_\lambda 1}\right) \quad \text{(Equation 7)}$$

$$\beta 2 - \sin^{-1}\left(\frac{n1\_\lambda 2 \times \sin(\alpha 1)}{n2\_\lambda 2}\right) > \sin^{-1}\left(\frac{n1\_\lambda 2}{n2\_\lambda 2}\right) \quad \text{(Equation 8)}$$

In Equations 7 and 8, n1_λ1 can be the refractive index of DTI 820a/silicon dioxide with the incident wavelength equals λ1 of light component 814, whereas n2_λ1 can be the refractive index of sub-pixel 812a/silicon with the incident wavelength equals λ1 of light component 814. Moreover, n1_λ2 can be the refractive index of DTI 820a/silicon dioxide with the incident wavelength equals λ2 of light component 816, whereas n2_λ1 can be the refractive index of sub-pixel 812a/silicon with the incident wavelength equals λ2 of light component 816.

In addition, slope angles 131 and 132 can be configured based on other criteria, such as to maximize the total internal reflection of in-band light component and/or to minimize the total internal reflection of out-of-band light component at the respective sub-pixel. For example, slope angle β1 can be made smaller than is required to satisfy Equation 8, and becomes smaller than slope angle β2, to reduce the total internal reflection of any light component 816 that enters sub-pixel 812a as cross-talk, and to maximize the total internal reflection of in-band light component 814 across a range of incident angles α1. Moreover, slope angle 132 can be configured to maximize the total internal reflection of in-band light component 816 across the range of incident angles α1. Slope angles β1 and β2 can be configured based on, for example, selecting different pitch sizes p1 and p2, different vertical heights v1 and v2, etc., for first optical structure 930 and second optical structure 932.

In some examples, the optical structures can also be implemented with different materials to facilitate total internal reflection of in-band light components at the respective sub-pixel. For example, referring to FIG. 9B, oxide layer 810 can be positioned between filter element 808a and sub-pixel 812a. First optical structure 930 can include complementary protrusion structures 940 and 942, whereas second optical structure 950 can include complementary protrusion structures 960 and 962. Protrusion structure 940 can include silicon dioxide as an extension of oxide layer 810. In addition, a layer 964 can be positioned between filter element 808b and sub-pixel 812b, and protrusion structure 960 can be made of the same material as layer 964. In some examples, protrusion structure 960 of second optical structure 950 can have a larger refractive index than first optical structure 930, even for the same incident wavelength. With such an arrangement, second optical structure 950 can have a higher refractive index for the incident wavelength of light component 816 (at 940 nm) compared with Table 1, which can reduce the critical angle requirement for light component 816. This allows second optical structure 932 to have a slope angle β2, similar to slope angle β1 of first optical structure 930, while satisfying the requirement of Equation 8.

In addition, first optical structure 930 and second optical structure 950 can be configured to steer the respective in-band light components by diffraction, when the pitch size of the optical structures is equal to or exceed the wavelength of the in-band light component to be steered. First optical structure 930 and second optical structure 950 can have different diffraction properties tailored based on the wavelengths of, respectively, light components 814 and 816, to maximize the reflection of the in-band light component at the DTI 822, which in turn can increase the optical propagation path and absorption of the in-band light component within the photodiode. Specifically, as shown in FIG. 9C, first optical structure 930, which is configured to steer infrared light component 814 by diffraction, can have a pitch size p1 that is equal to or exceeds the wavelength of infrared light component 814 (e.g., 780 nm). Moreover, second optical structure 950, which is configured to steer a visible light component 816 by diffraction and can also include same material as oxide layer 810, can have a pitch size p2 that is equal to or exceeds the wavelength of visible light component 816 (380 to 700 nm), but less than the wavelength of infrared light component 814 so as not to diffract infrared light component 814 if it enters sub-pixel 812b by crosstalk. DTI 822 can also be coated with a reflective material to further increase the reflection of the light components. In some examples, the vertical heights of first optical structure 930 and second optical structure 950 (e.g., along the Z-axis) can also be different to maintain a particular crystallography angle of silicon (e.g., 54.7 degrees).

In some examples, first optical structure 930 and second optical structure 950 can steer the in-band light component through a combination of diffraction and refraction (followed by total internal reflection). The geometries of the first and second optical structures can be configured to, for example, allow one of diffraction or refraction to dominate. For example, as explained above, refraction can dominate when the pitch size is smaller than the wavelength of the in-band component, whereas diffraction can dominate when the pitch size is equal to or larger than the wavelength of the in-band component. Moreover, in a case where the selected pitch size of the optical structure is below both the pitch size of a photodiode and the wavelength of light, refraction can dominate. In such a case, an array of protrusion structures can be formed over the photodiode as the first or second optical structure, with the pitch size and geometry (e.g., slope angle, height) of each protrusion structure configured based on the wavelength of the in-band component to be diffracted and internally reflected.

Figure 10A:
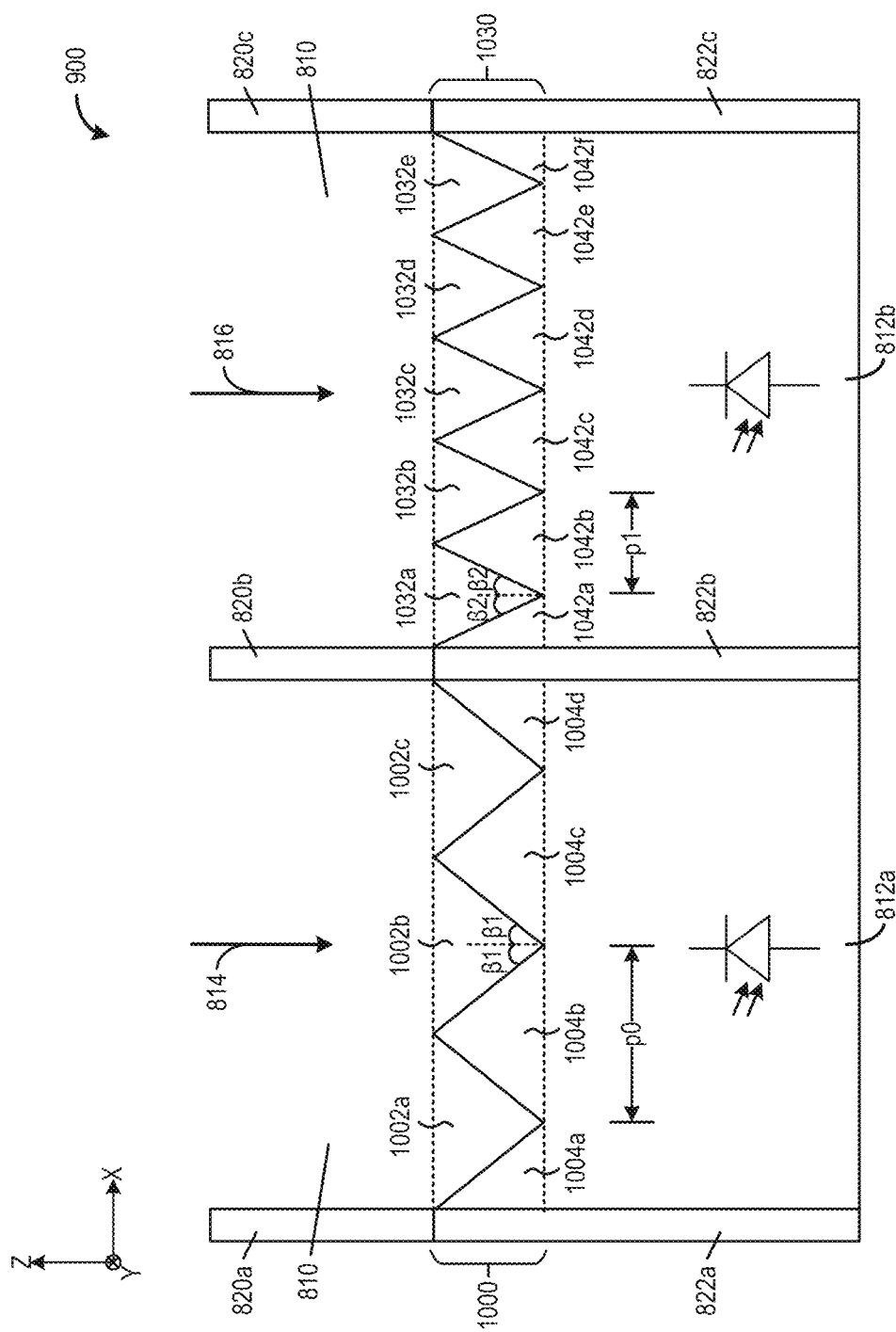
FIG. 10A and FIG. 10B illustrate examples of internal components of the multi-spectral pixel cell of FIG. 9A and FIG. 9B.
Figure 10B:
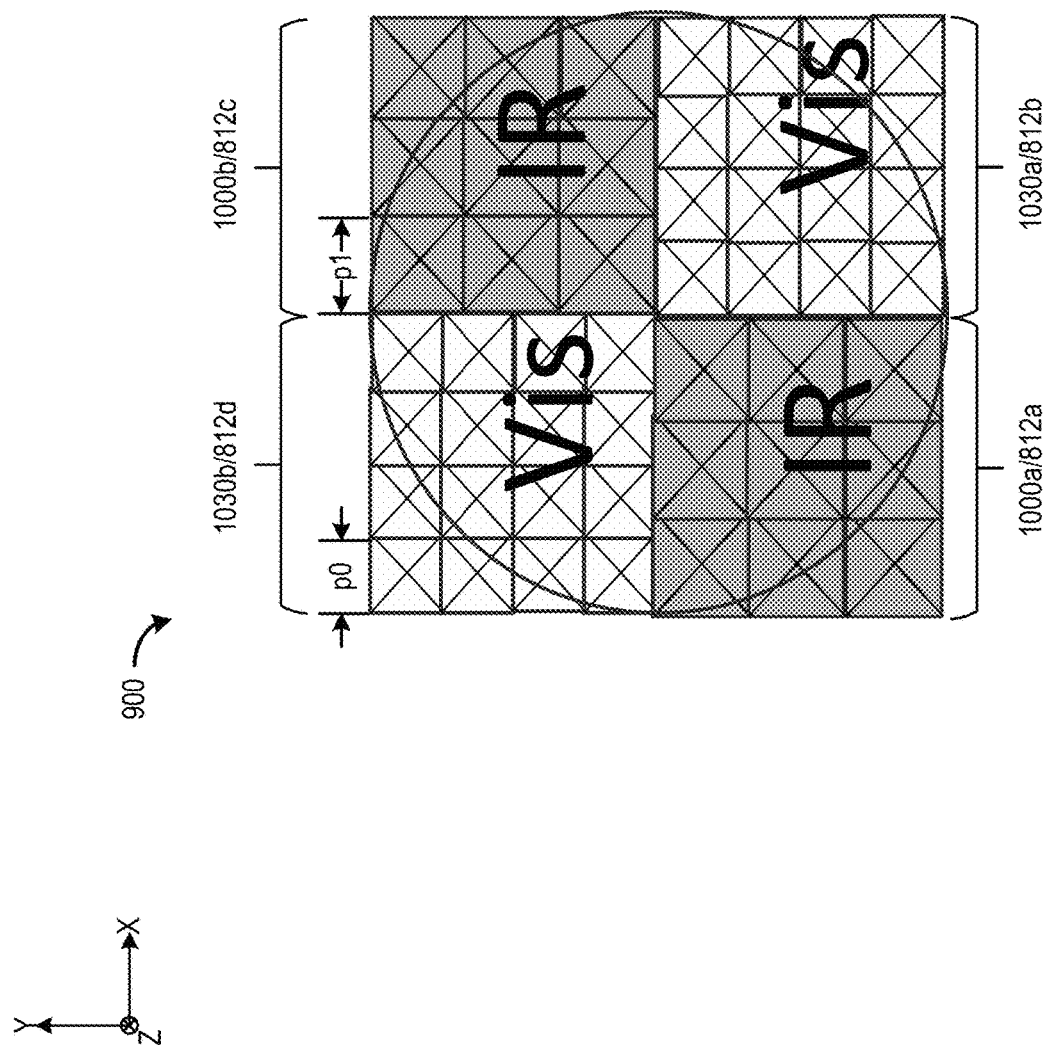

FIG. 10A illustrates an array of complimentary protrusion structures 1000, including an array of first protrusion structures 1002 formed as an extension of oxide layer 810 or other materials, and an array of second protrusion structures 1004 formed as an extension of sub-pixel 812a. For example, an array of first protrusion structures 1002 can include first protrusion structures 1002a, 1002b, and 1002c, whereas array of second protrusion structures 1004 can include second protrusion structures 1004a, 1004b, 1004c, and 1004d. First complementary protrusion structures 1000 can be formed over sub-pixel 812a as first optical structure 930, whereas array of second complementary protrusion structures 1030 can be formed over sub-pixel 812b as second optical structure 930. The different arrays of protrusion structures can have different pitch sizes p0/p1, different slope angles β1 and β2, etc., defined based on the critical angles of total internal reflect of the respective light components 814 and 816, as described above. In FIG. 10B, which illustrates a top view of pixel cell 900, sub-pixel 812a is represented by an "IR" label and sub-pixel 812b is represented by a "VIS" label. Additional sub-pixels 812c (for detecting infrared light) and 812d (for detecting visible light) are also shown. In FIG. 10C, pixel cell 900 can have an array of first complementary protrusion structures 1000a and 1000b over sub-pixel 812a and sub-pixel 812c, and an array of second complementary protrusion structures 1030a and 1030b over sub-pixel 812b and sub-pixel 812d.

Figure 11A:
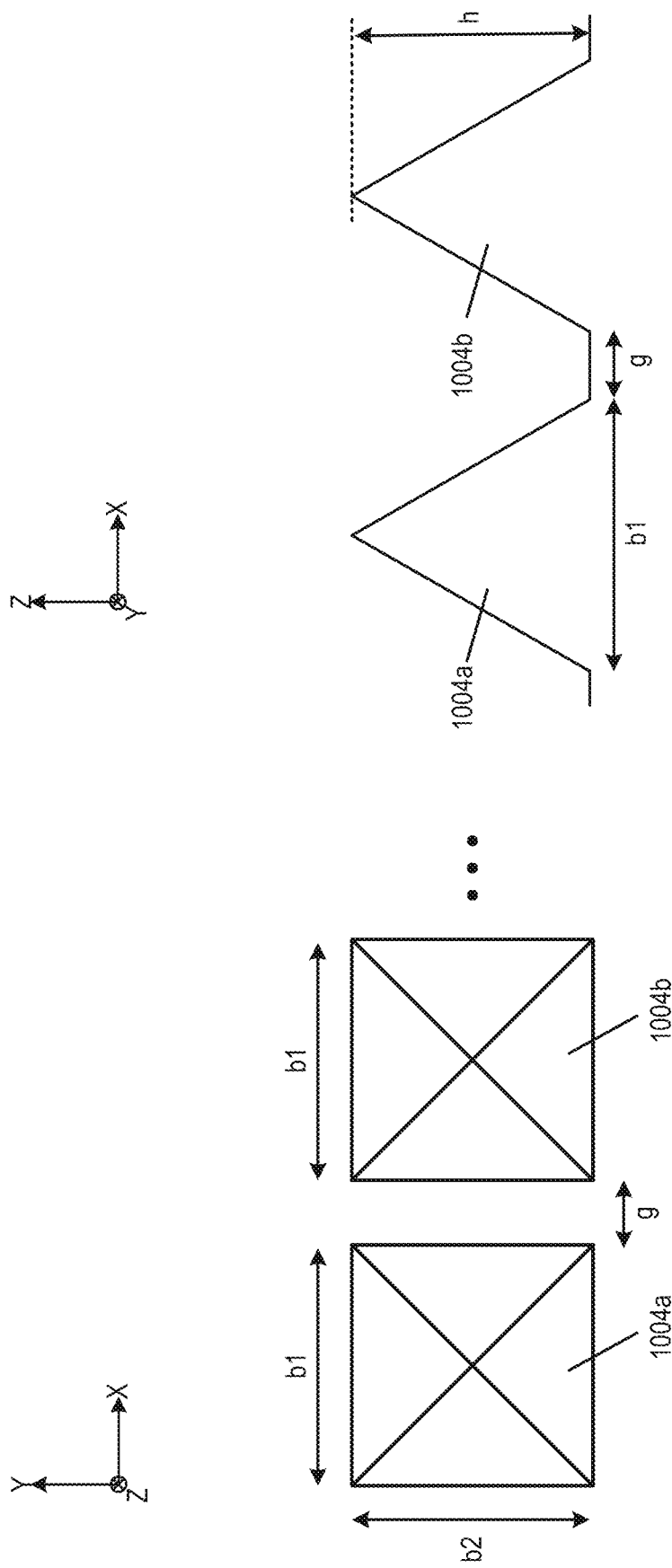
FIG. 11A, FIG. 11B, and FIG. 11C illustrate examples of internal components of the multi-spectral pixel cell of FIG. 9A and FIG. 9B.
Figure 11B:
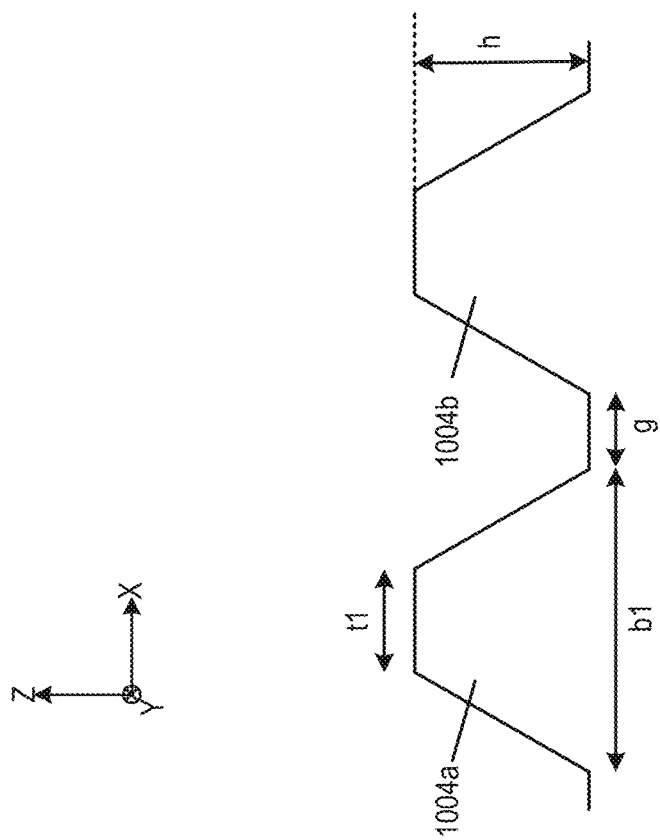
Figure 11B:
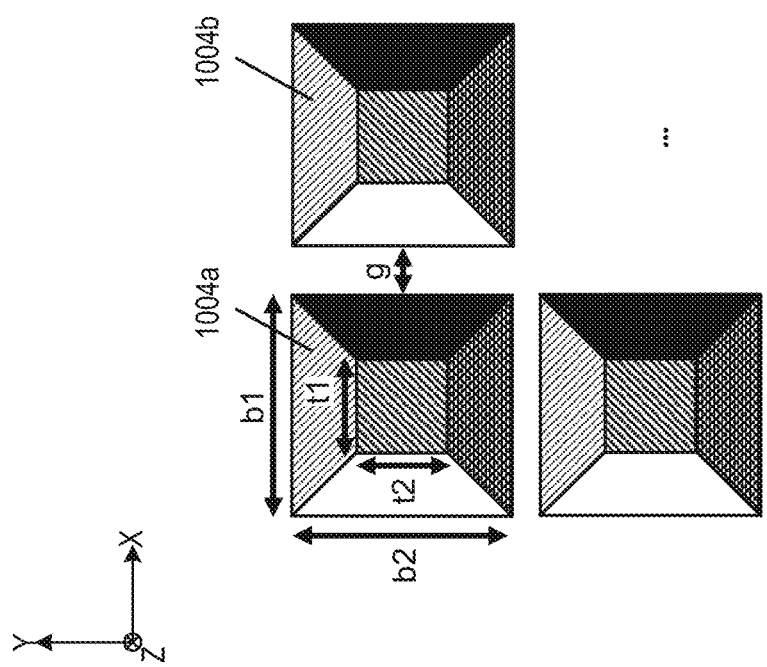
Figure 11C:
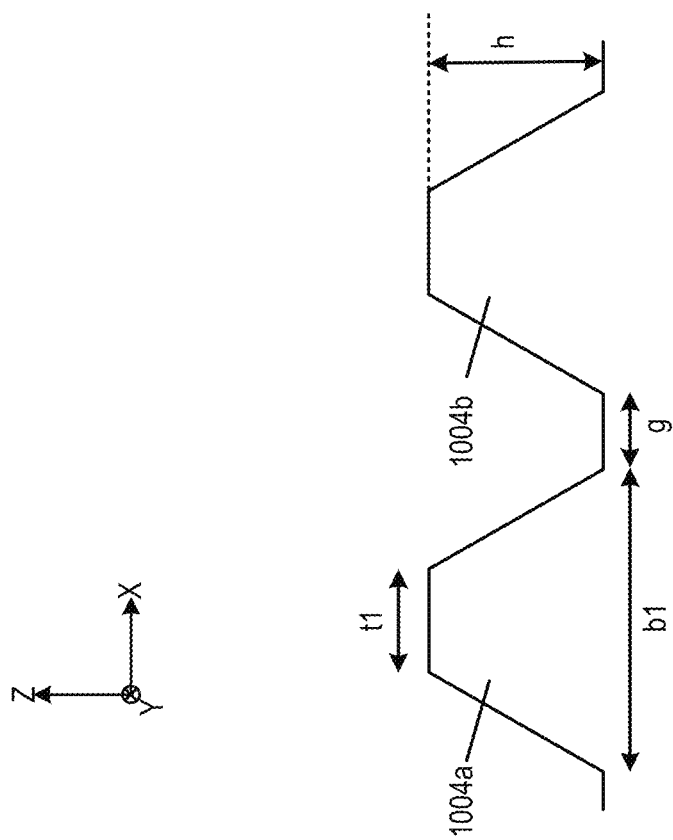
Figure 11C:
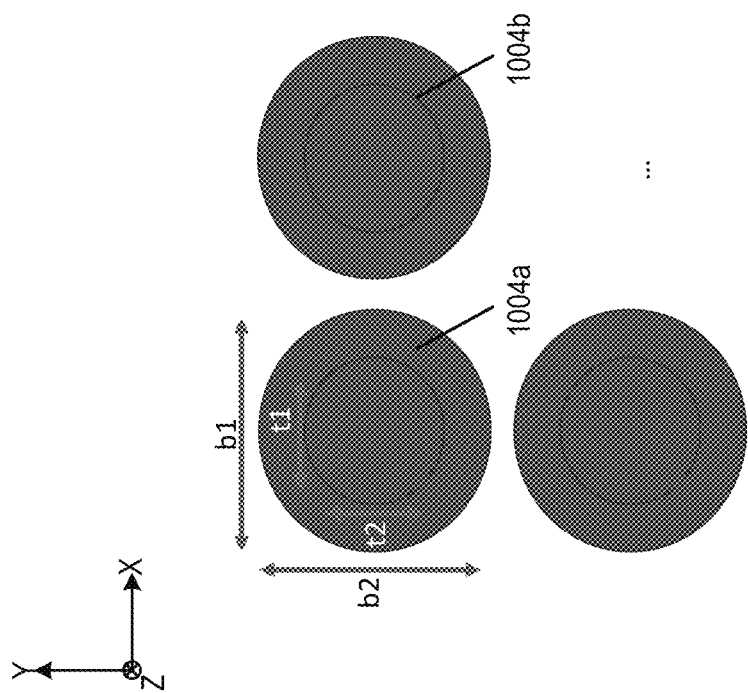

The protrusion structures of first and second optical structures can have various geometric shapes to provide the sloped light transmission surfaces. FIG. 11A, FIG. 11B, and FIG. 11C illustrate example geometric shapes of the protrusion structures. FIG. 11A illustrates the top view and side view of an example of second protrusion structures 1004a and 1004b (formed in the sub-pixel layer) having a pyramid shape. In FIG. 11A, second protrusion structures 1004a and 1004b can have a base dimension of b1×b2. Protrusion structures 1004a and 1004b can be separated by a gap of g, and the array of second protrusion structures can have a pitch size of b1+g. As described above, b1 and b2, together with the vertical height h, can set the slope angles of the light transmission surfaces. The pitch size and the slope angles are set based on the incident wavelength of the light component. Typically b1 and b2 are identical, such that protrusion structures 1004*a* and 1004*b* are symmetric along both the X-axis and the Y-axis.

FIG. 11B illustrates the top view and side view of another example of second protrusion structures 1004*a* and 1004*b* having a trapezium pyramid shape. In FIG. 11B, second protrusion structures 1004*a* and 1004*b* can also have a base dimension of b1×b2, and a top dimension of t1×t2. Protrusion structures 1004*a* and 1004*b* can be separated by a gap of g, and the array of second protrusion structures can have a pitch size of b1+g. The slope angle of the light transmission surfaces can be set based on b1, b2, t1, t2, and the vertical height h between the top and base. As in FIG. 11A, b1 and b2 are typically identical, and t1 and t2 are also identical, such that protrusion structures 1004*a* and 1004*b* are symmetric along both the X-axis and the Y-axis.

FIG. 11C illustrates the top view and side view of another example of second protrusion structures 1004*a* and 1004*b* having a trapezium cone shape. In FIG. 11C, second protrusion structures 1004*a* and 1004*b* can also have a base dimension of b1×b2, and a top dimension of t1×t2, but with a circular footprint. Protrusion structures 1004*a* and 1004*b* can be separated by a gap of g, and the array of second protrusion structures can have a pitch size of b1+g. The slope angle of the light transmission surfaces can be set based on b1, b2, t1, t2, and the vertical height h between the top and base. As in FIG. 11A and FIG. 11B, b1 and b2 are typically identical, and t1 and t2 are also identical, such that protrusion structures 1004*a* and 1004*b* are symmetric along both the X-axis and the Y-axis. In some examples, second protrusion structures 1004*a* and 1004*b* can also have a triangular cone shape.

Figure 12:
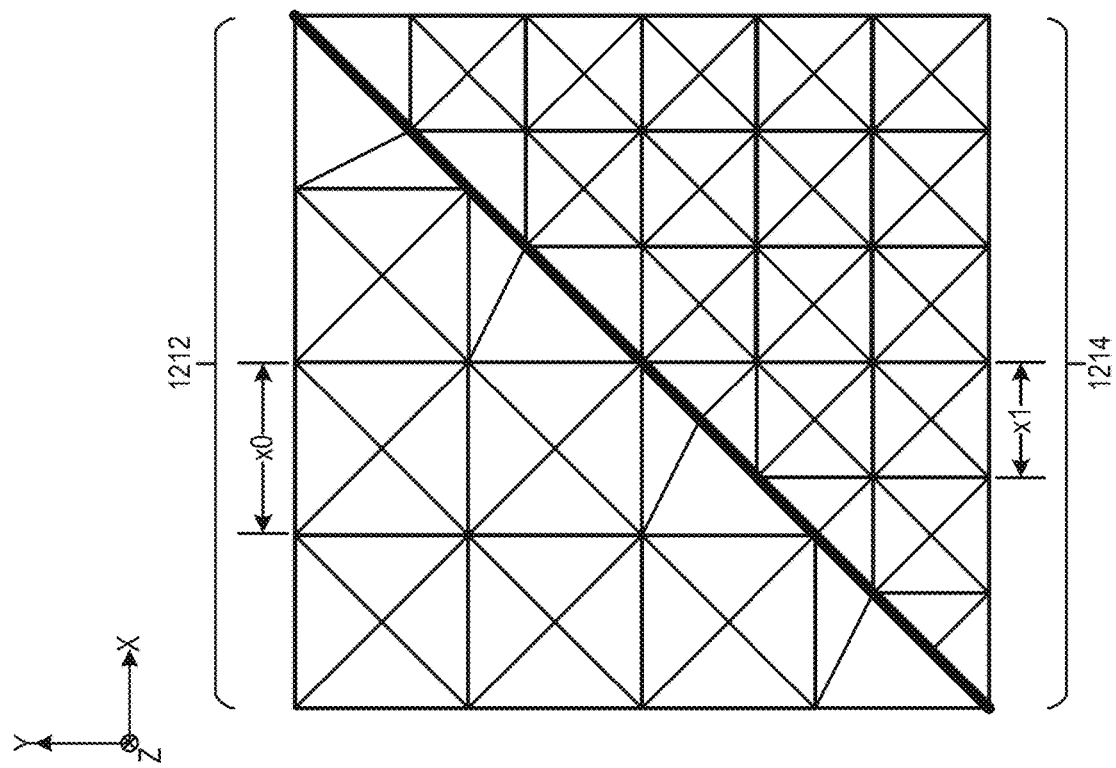
FIG. 12 illustrates another example of a multi-spectral pixel cell.
Figure 12:
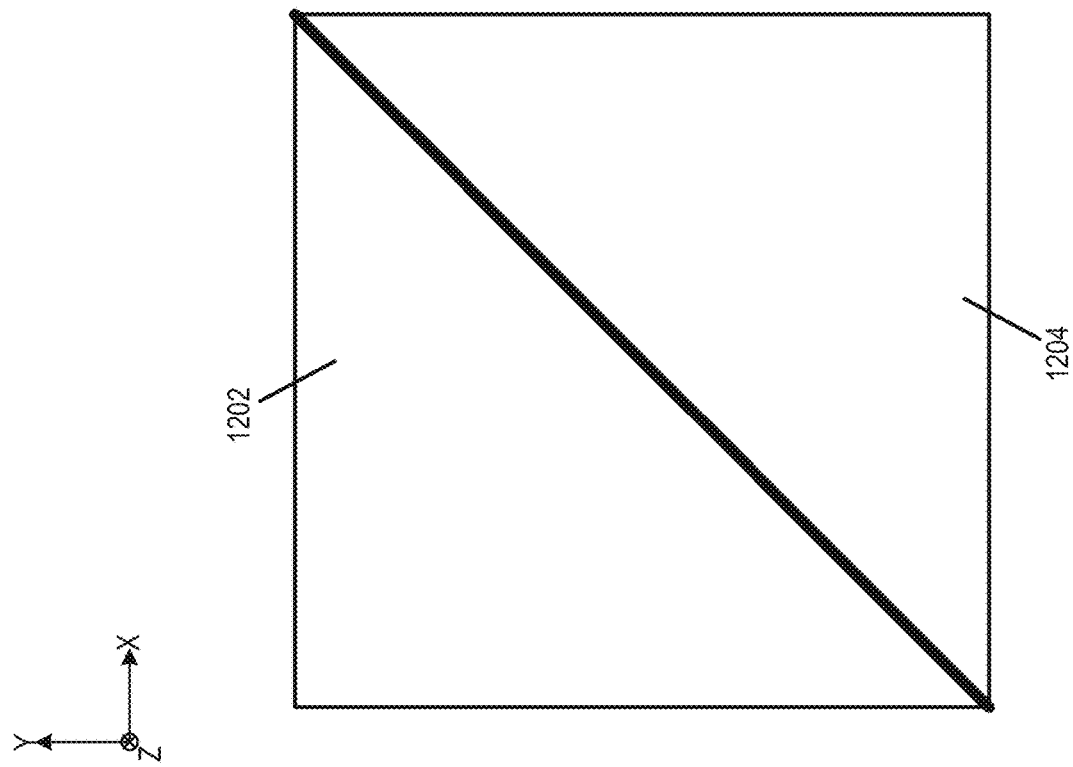

FIG. 12 illustrates another example of a multi-spectral pixel cell 1200. As shown on the left of FIG. 12, pixel cell 1200 includes two sub-pixels 1202 and 1204, each having a triangular shape. Sub-pixel 1202 can be configured to detect the infrared light component, whereas sub-pixel 1204 can be configured to detect the visible light component. As shown on the right of FIG. 12, sub-pixel 1202 can be covered with an array of first protrusion structures 1212 having a pitch size of x0, whereas sub-pixel 1204 can be covered with an array of second protrusion structures 1214 having a pitch size of xl. Pixel cells having triangular sub-pixels can be provided to support various applications, such as applications where the features to be detected from an image captured by an image sensor have triangular shapes.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims. For instance, any of the examples, alternative examples, and the concepts thereof may be applied to any other examples described and/or within the spirit and scope of the disclosure.

The use of the terms "a," "an," and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning including, but not limited to) unless otherwise noted. The term "connected" is to be construed as partly or wholly contained within, attached to, or joined together, even if there is something intervening. The phrase "based on" should be understood to be open-ended and not limiting in any way and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order, unless otherwise indicated herein or otherwise clearly contradicted by context. The use of any and all examples or exemplary language (e.g., "such as") provided herein, is intended merely to better illuminate examples of the disclosure and does not pose a limitation on the scope of the disclosure, unless otherwise claimed. No language in the specification should be construed as indicating any non-claimed element as essential to the practice of the disclosure.

What is claimed is:

1. An apparatus, comprising:
a semiconductor substrate including a first photodiode and a second photodiode, the first photodiode being positioned adjacent to the second photodiode along a first axis, the first photodiode being configured to convert a first component of light to a first charge, the second photodiode being configured to convert a second component of the light to a second charge, the first component and the second component being associated with, respectively, a first wavelength and a second wavelength;
a first optical structure and a second optical structure positioned over, respectively, the first photodiode and the second photodiode along a second axis perpendicular to the first axis,
wherein:
the first optical structure is configured to:
receive the first component of the light at a first angle with respect to the second axis, and
steer the first component of the light at a second angle with respect to the second axis towards the first photodiode, the second angle being configured to increase a propagation path of the first component of the light within the first photodiode compared with the first angle;
the second optical structure is configured to:
receive the second component of the light at a third angle with respect to the second axis, and
steer the second component of the light at a fourth angle with respect to the second axis towards the second photodiode, the fourth angle being configured to increase a propagation path of the second component of the light within the second photodiode compared with the third angle;
the first optical structure has a first optical property based on the first wavelength; and
the second optical structure has a second optical property based on the second wavelength; and
an optical element positioned over the first optical structure and the second optical structure along the second axis to receive the light and to project the light towards the first optical structure and the second optical structure.

2. The apparatus of claim 1, wherein the first optical structure includes a first protrusion structure having a first sloped-light transmission surface, the first sloped-light transmission surface forming a first slope angle with respect to the second axis;
  wherein the second optical structure includes a second protrusion structure having a second sloped-light transmission surface, the second sloped-light transmission surface forming a second slope angle with respect to the second axis;
  wherein the first slope angle is based on the first wavelength; and
  wherein the second slope angle is based on the second wavelength.

3. The apparatus of claim 2, wherein the first slope angle is such that at least some of the second component of the light, upon being directed by the first optical structure into the first photodiode as cross-talk, does not undergo a total internal reflection within the first photodiode.

4. The apparatus of claim 2, wherein:
  the first protrusion structure has a first width along the first axis;
  the second protrusion structure has a second width along the first axis; and
  the first protrusion structure and the second protrusion structure have the same height along the second axis.

5. The apparatus of claim 2, wherein:
  the first protrusion structure has a first height along the second axis;
  the second protrusion structure has a second height along the second axis; and
  the first protrusion structure and the second protrusion structure have the same width along the first axis.

6. The apparatus of claim 2, wherein the first slope angle and the second slope angle are based on a material cut condition of the semiconductor substrate.

7. The apparatus of claim 2, wherein the first protrusion structure and the second protrusion structure comprise at least one of: a triangular pyramid, a trapezium pyramid, a triangular cone, or a trapezium cone.

8. The apparatus of claim 2, wherein the first optical structure is made of a first material having a first refractive index for the first wavelength; and
  wherein the second optical structure is made of a second material having a second refractive index for the second wavelength.

9. The apparatus of claim 8, wherein the first refractive index is based on a first target critical angle for a total internal reflection within the first photodiode, and the first slope angle; and
  wherein the second refractive index is based on a second target critical angle for a total internal reflection within the second photodiode, and the second slope angle.

10. The apparatus of claim 1, wherein the first optical structure includes an array of first protrusion structures configured to diffract the first component of the light and direct the diffracted first component of the light into the first photodiode, the array of first protrusion structures having a first pitch size;
  wherein the second optical structure includes an array of second protrusion structures configured to diffract the second component of the light and direct the diffracted second component of the light into the second photodiode, the array of second protrusion structures having a second pitch size;
  wherein the first pitch size is based on the first wavelength; and
  wherein the second pitch size is based on the second wavelength.

11. The apparatus of claim 10, wherein each first protrusion structure of the array of first protrusion structures includes a first sloped light transmission surface, the first sloped light transmission surface forming a first slope angle with respect to the second axis;
  wherein each second protrusion structure of the array of second protrusion structures includes a second sloped light transmission surface, the second sloped light transmission surface forming a second slope angle with respect to the second axis;
  wherein the first slope angle is based on the first wavelength; and
  wherein the second slope angle is based on the second wavelength.

12. The apparatus of claim 1, wherein the semiconductor substrate further comprises a first deep trench isolation (DTI) formed on one side of the first photodiode along the second axis and a second DTI formed on one side of the second photodiode along the second axis;
  wherein a total internal reflection of the first component of the light occurs on the first DTI; and
  wherein a total internal reflection of the second component of the light occurs on the second DTI.

13. The apparatus of claim 1, wherein each of the first photodiode and the second photodiode has a triangular footprint.

14. The apparatus of claim 1, wherein the optical element is configured to direct light from a spot of a scene to both the first photodiode and the second photodiode.

15. The apparatus of claim 14, wherein the first photodiode and the second photodiode are part of, respectively, a first sub-pixel and a second sub-pixel;
  wherein the apparatus is configured to:
    generate a first pixel of a first image frame based on a first output of the first photodiode; and
    generate a second pixel of a second image frame based on a second output of the second photodiode; and
  wherein a location of the first pixel in the first image frame corresponds to a location of the second pixel in the second image frame.

16. The apparatus of claim 14, wherein the optical element comprises at least one of: a microlens, a metalens, or a liquid crystal hologram.

17. An apparatus comprising:
  an array of pixel cells, each pixel cell comprising:
    a semiconductor substrate including a first photodiode and a second photodiode, the first photodiode being positioned adjacent to the second photodiode along a first axis, the first photodiode being configured to convert a first component of light to a first charge, the second photodiode being configured to convert a second component of the light to a second charge, the first component and the second component being associated with, respectively, a first wavelength and a second wavelength; and
    a first optical structure and a second optical structure positioned over, respectively, the first photodiode and the second photodiode along a second axis perpendicular to the first axis,
    wherein:
      the first optical structure is configured to:
        receive the first component of the light at a first angle with respect to the second axis, and
        steer the first component of the light at a second angle with respect to the second axis towards the first photodiode, the second angle being configured to increase a propagation path of the first component of the light within the first photodiode compared with the first angle;

the second optical structure is configured to:
receive the second component of the light at a third angle with respect to the second axis, and
steer the second component of the light at a fourth angle with respect to the second axis towards the second photodiode, the fourth angle being configured to increase a propagation path of the second component of the light within the second photodiode compared with the third angle;

the first optical structure has a first optical property based on the first wavelength; and the second optical structure has a second optical property based on the second wavelength;

and one or more optical elements positioned over the array of pixel cells along the second axis to receive the light and to project the light towards the first optical structure and the second optical structure of each pixel cell of the array of pixel cells.

18. The apparatus of claim 17, wherein:

the first optical structure includes an array of first protrusion structures configured to diffract the first component of the light and direct the diffracted first component of the light into the first photodiode, the array of first protrusion structures having a first pitch size based on the first wavelength;

the second optical structure includes an array of second protrusion structures configured to diffract the second component of the light and direct the diffracted second component of the light into the second photodiode, the array of second protrusion structures having a second pitch size based on the second wavelength;

each first protrusion structure of the array of first protrusion structures includes a first sloped light transmission surface, the first sloped light transmission surface forming a first slope angle with respect to the second axis;

each second protrusion structure of the array of second protrusion structures includes a second sloped light transmission surface, the second sloped light transmission surface forming a second slope angle with respect to the second axis;

wherein the first slope angle is based on the first wavelength; and wherein the second slope angle is based on the second wavelength.

19. The apparatus of claim 17, further comprising:

a processor configured to process outputs of the array of pixel cells to generate image frames; and a display configured to display content based on the image frames.

20. The apparatus of claim 17, wherein the apparatus is part of a mobile device.

* * * * *